United States Patent
Bang et al.

(10) Patent No.: US 11,217,638 B2
(45) Date of Patent: Jan. 4, 2022

(54) DISPLAY DEVICE

(71) Applicant: Samsung Display Co., Ltd., Yongin-si (KR)

(72) Inventors: Ki Ho Bang, Hwaseong-si (KR); Won Suk Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/011,956

(22) Filed: Sep. 3, 2020

(65) Prior Publication Data

US 2021/0280641 A1    Sep. 9, 2021

(30) Foreign Application Priority Data

Mar. 3, 2020    (KR) .......................... 10-2020-0026459

(51) Int. Cl.
*H01L 27/32*    (2006.01)
*H01L 51/52*    (2006.01)

(52) U.S. Cl.
CPC ........ *H01L 27/323* (2013.01); *H01L 27/3276* (2013.01); *H01L 51/5253* (2013.01)

(58) Field of Classification Search
CPC .............. H01L 27/323; H01L 27/3276; H01L 27/3279; H01L 51/5253; G06F 3/044; G06F 3/0445
See application file for complete search history.

(56) References Cited

U.S. PATENT DOCUMENTS

| | | | | |
|---|---|---|---|---|
| 10,824,259 | B2* | 11/2020 | Jin | G06F 3/04164 |
| 10,886,339 | B2* | 1/2021 | Won | H01L 51/0097 |
| 2016/0334910 | A1* | 11/2016 | Ono | G06F 3/0412 |
| 2019/0252412 | A1 | 8/2019 | An et al. | |
| 2019/0341429 | A1 | 11/2019 | Park | |
| 2019/0377445 | A1* | 12/2019 | Jeong | G06F 3/0412 |
| 2020/0192507 | A1* | 6/2020 | Bu | G02F 1/1345 |
| 2021/0005696 | A1 | 1/2021 | Bang et al. | |

FOREIGN PATENT DOCUMENTS

| KR | 2019-0096553 | 8/2019 |
|---|---|---|
| KR | 2019-0140132 | 12/2019 |
| KR | 10-2021-0004008 | 1/2021 |

* cited by examiner

*Primary Examiner* — Sardis F Azongha
(74) *Attorney, Agent, or Firm* — H.C. Park & Associates, PLC

(57) ABSTRACT

Provided is a display device including a substrate including a display area, a non-display area, which is disposed on a periphery of the display area, and a bendable area, which is disposed on one side of the non-display area, a display layer disposed on the substrate and including light-emitting elements, a sensor electrode layer disposed on the display layer, power supply lines disposed to extend from the display layer in the display area to the non-display area and the bendable area, and sensor wires disposed to extend from the sensor electrode layer to the non-display area and the bendable area, wherein in the non-display area and the bendable area, the power supply lines and the sensor wires overlap.

18 Claims, 17 Drawing Sheets

DISPLAY DEVICE

CROSS REFERENCE TO RELATED APPLICATION

This application claims priority from and the benefit of Korean Patent Application No. 10-2020-0026459, filed on Mar. 3, 2020, which is hereby incorporated by reference for all purposes as if fully set forth herein.

BACKGROUND

Field

Exemplary embodiments/implementations of the invention relate generally to a display device.

Discussion of the Background

Display devices have increasingly become of importance with the development of multimedia, and various types of display devices, such as a liquid crystal display (LCD) device, an organic light-emitting diode (OLED) display device, or the like, have been used.

Recently, touch members capable of recognizing touch input have been applied to display devices, particularly, smartphones or tablet personal computers (PCs). Specifically, a touch member can be formed directly on a display member to facilitate the fabrication of a thin display device and the simplification of the manufacture of a display device. Because the touch member can be formed directly on the display member, wiring of the display member and wiring of the touch member can be disposed together in the same area to be spaced apart from each other. Accordingly, research is needed into ways to efficiently arrange the wiring of the display member and the wiring of the touch member together.

The above information disclosed in this Background section is only for understanding of the background of the inventive concepts, and, therefore, it may contain information that does not constitute prior art.

SUMMARY

Embodiments of the present disclosure provide a display device capable of reducing the resistances of wires in a bendable area and reducing short defects between wires.

Additional features of the inventive concepts will be set forth in the description which follows, and in part will be apparent from the description, or may be learned by practice of the inventive concepts.

Exemplary embodiments provide a substrate including a display area, a non-display area, which is disposed on a periphery of the display area, and a bendable area, which is disposed on one side of the non-display area, a display layer disposed on the substrate and including light-emitting elements, a sensor electrode layer disposed on the display layer, power supply lines disposed to extend from the display layer in the display area to the non-display area and the bendable area, and sensor wires disposed to extend from the sensor electrode layer to the non-display area and the bendable area, wherein in the non-display area and the bendable area, the power supply lines and the sensor wires overlap.

The power supply lines and the sensor wires are arranged in parallel and at least partially overlap.

In the bendable area, the power supply lines overlap one-to-one or one-to-many with the sensor wires.

A width of one of the power supply lines and the sensor wires is greater than a width of the other the power supply lines and the sensor wires.

The display device further includes metal patterns disposed between the sensor wires.

The metal patterns are disposed to extend from the non-display area to the bendable area.

At least one metal pattern is disposed between two sensor wires.

Exemplary embodiments also provide a substrate including a display area, a non-display area, which is disposed on a periphery of the display area, and a bendable area, which is disposed on one side of the non-display area, a display layer disposed on the substrate, in the display area, and including light-emitting elements, a sensor electrode layer disposed on the display layer, power supply lines disposed to extend from the display layer in the display area to the non-display area and the bendable area, organic layers disposed on the power supply lines to extend from the display area to the non-display area, and sensor wires disposed on the organic layers to extend from the sensor electrode layer to the non-display area and the bendable area, wherein in the non-display area and the bendable area, the power supply lines and the sensor wires overlap with the organic layers interposed therebetween.

The display layer includes a thin-film transistor and the power supply lines, which are disposed on the substrate, the organic layers, which are disposed on the TFT and the power supply lines, and a light-emitting element layer, which is disposed on the organic layers.

The TFT includes an active layer, which is disposed on the substrate, a gate electrode, which is disposed on the active layer, first and second electrodes, which are disposed on the gate electrode and are connected to the active layer, and inorganic insulating layers, which are disposed between the active layer and the gate electrode and between the gate electrode and the first electrode.

The inorganic insulating layers are disposed in the display area and the non-display area and do not overlap with the bendable area.

The display device further comprises metal patterns disposed between the sensor wires, wherein the metal patterns overlap with the non-display area and the bendable area.

The metal patterns are disposed to overlap with the inorganic insulating layers and the organic layers, in the non-display area, and to overlap with the organic layers, in the bendable area.

The sensor electrode layer includes driving electrodes and sensing electrodes, which are disposed on the display layer, and a sensor insulating layer, which is disposed on the driving electrodes and the sensing electrodes.

The sensor insulating layer is disposed in the display area and the non-display area and does not overlap with the bendable area.

The sensor wires are connected to the driving electrodes and the sensing electrodes to extend to the non-display area and the bendable area.

The sensor wires are in contact with a top surface and a side surface of the sensor insulating layer, in the non-display area, and are disposed on the organic layers, in the bendable area.

Each of the sensor wires includes a first layer, a second layer, which is disposed on the first layer, and a third layer, which is disposed on the second layer, and the first layer includes metal nitride.

The first layer is in contact with the organic layers.

Each of the sensor wires further includes a sub-layer, which is interposed between the first and second layers and includes a metal.

According to the aforementioned and other embodiments of the present disclosure, power supply lines and sensor wires are disposed to overlap in a non-display area and a bendable area. Thus, the resistance of wires can be reduced in the non-display area and the bendable area by increasing the width of the wires, and any short circuit between the wires can be prevented by increasing the distance between the wires.

Also, the sensor wires are disposed to extend in and across the non-display area and the bendable area, as a third metal layer. Thus, the resistance of the sensor wires can be reduced.

Other features and embodiments may be apparent from the following detailed description, the drawings, and the claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

The above and other embodiments and features of the present disclosure will become more apparent by describing in detail embodiments thereof with reference to the attached drawings, in which.

DETAILED DESCRIPTION

Figure 1:
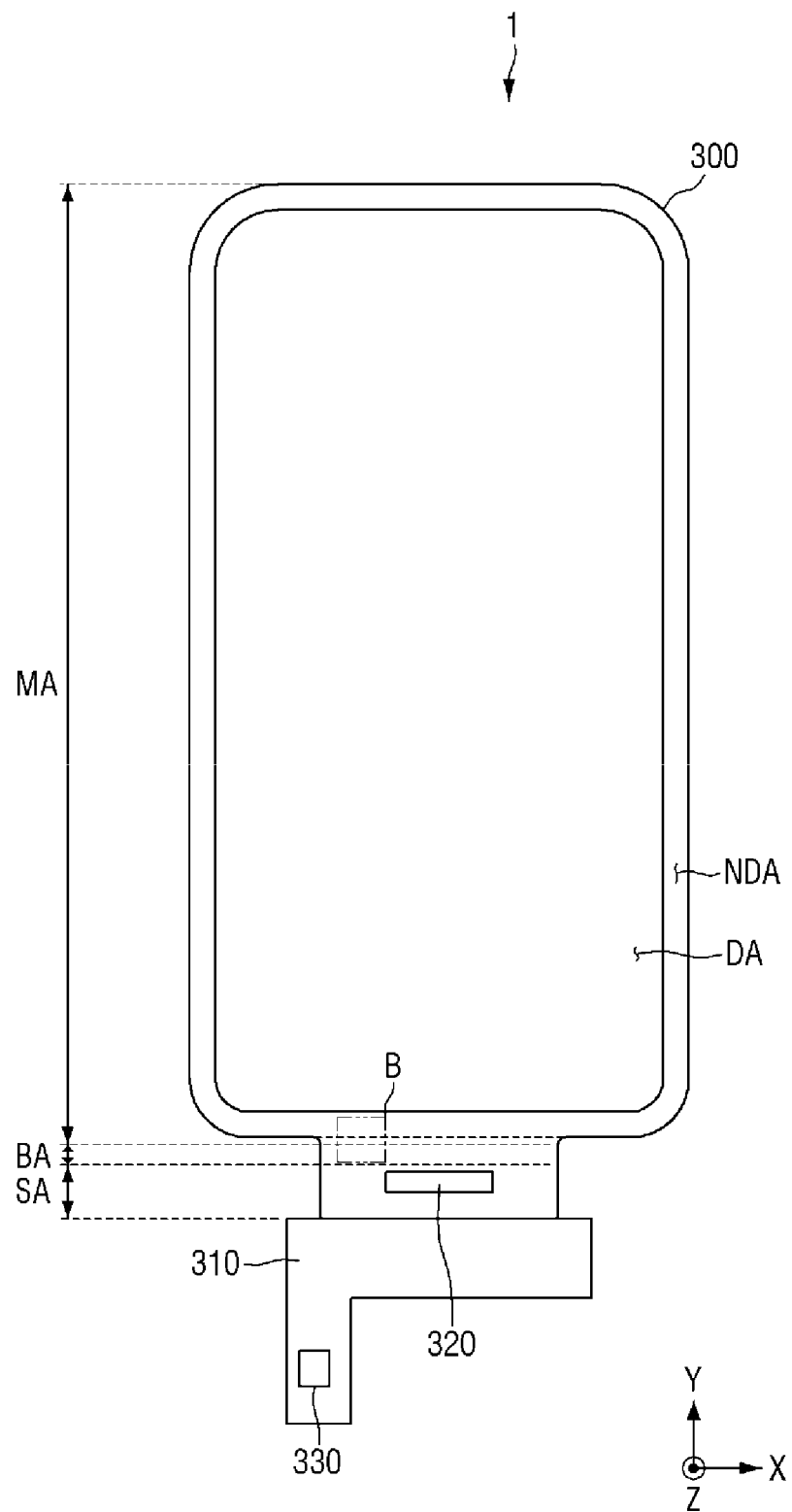
FIG. 1 is a plan view illustrating a display device according to an embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device according to an embodiment of the present disclosure.

Referring to FIG. 1, a display device 1 can be applied to a portable electronic device such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). Also, the display device 1 can be applied as the display unit of a television (TV), a notebook computer, a monitor, a billboard, or an Internet-of-Things (IoT) device. Also, the display device 1 can be applied to a wearable device such as a smartwatch, a watchphone, a glasses display, or a head-mounted display (HMD). Also, the display device 1 can be applied to the dashboard, the center fascia, or the center information display (CID) of a vehicle, the room mirror display of a vehicle that can replace side-view mirrors, or an entertainment display disposed at the rear of the front seat of a vehicle.

A first direction (or an X-axis direction) may be the direction of the short sides of the display device 1, for example, a horizontal direction of the display device 1. A second direction (or a Y-axis direction) may be the direction of the long sides of the display device 1, for example, a vertical direction of the display device 1. A third direction (or a Z-axis direction) may be the thickness direction of the display device 1.

The display device 1 may have an almost rectangular shape in a plan view. For example, the display device 1 may have an almost rectangular shape with short sides in the first direction (or the X-axis direction) and long sides in the second direction (or the Y-axis direction) in a plan view. The corners at which the short sides and the long sides of the display device 1 meet may be rounded or right-angled. The planar shape of the display device 1 is not limited to a rectangular shape, and the display device 1 may be formed in various other shapes, such as another polygonal shape, a circular shape, or an elliptical shape.

The display device 1 may include a display panel 300, a display circuit board 310, a display driving circuit 320, and a touch driving circuit 330.

The display panel 300 may be a light-emitting display panel including light-emitting elements. For example, the display panel 300 may be an organic light-emitting diode (OLED) display panel using OLEDs that include organic light-emitting layers, a micro-light-emitting diode (micro-LED) display panel using micro-LEDs, a quantum-dot light-emitting diode (QLED) display panel using QLEDs that include quantum-dot light-emitting layers, or an inorganic electroluminescent (EL) display panel using inorganic light-emitting elements that include an inorganic semiconductor.

The display panel 300 may be a rigid display panel that is hardly bendable because of its rigidity or a flexible display panel that is easily bendable, foldable, or rollable because of its flexibility. For example, the display panel 300 may be a foldable display panel, a curved display panel having a curved display surface, a bent display panel that is bent in areas other than its display surface, a rollable display panel, or a stretchable display panel.

Also, the display panel 300 may be a transparent display panel that is transparent so that an object or the background at the bottom surface of the display panel 300 can be seen from the top surface of the display panel 300. Also, the display panel 300 may be a reflective display panel capable of reflecting an object or the background at the top surface of the display panel 300.

The display panel 300 may include a main area MA, a sub-area SA, which protrudes from one side of the main area MA, and a bendable area BA, which is disposed between the main area MA and the sub-area SA.

The main area MA may include a display area DA, which displays an image, and a non-display area NDA, which is on the periphery of the display area DA. The display area DA may account for most of the main area MA. The display area DA may be disposed in the middle of the main area MA. The non-display area NDA may be on the outside of the display area DA. The non-display area NDA may be defined as edge parts of the display panel 300.

The sub-area SA may protrude from one side of the main area MA in the second direction (or the Y-axis direction). Referring to FIG. 1, the length, in the first direction (or the X-axis direction), of the sub-area SA may be smaller than the length, in the first direction (or the X-axis direction), of the main area MA, and the length, in the second direction (or the Y-axis direction), of the sub-area SA may be smaller than the length, in the second direction (or the Y-axis direction), of the main area MA. However, the present disclosure is not limited to this.

The display circuit board 310 may be attached to the sub-area SA of the display panel 300. The display circuit board 310 may be attached on pads in the sub-area SA of the display panel 300 via a low-resistance, high-reliability material such as an anisotropic conductive film (ACF) or a self-assembly anisotropic conductive paste (SAP). The display circuit board 310 may be a flexible printed circuit board (FPCB) that is bendable, a rigid printed circuit board (PCB) that is too rigid to be bendable, or a hybrid PCB including both a rigid PCB and an FPCB.

The display driving circuit 320 may be disposed in the sub-area SA of the display panel 300. The display driving circuit 320 may receive control signals and power supply voltages and may generate signals and voltages to drive the display panel 300. The display driving circuit 320 may be formed as an integrated circuit (IC).

The touch driving circuit 330 may be disposed on the display circuit board 310. The touch driving circuit 330 may be formed as an IC. The touch driving circuit 330 may be attached to the display circuit board 310.

The touch driving circuit 330 may be electrically connected to sensor electrodes of a sensor electrode layer of the display panel 300 via the display circuit board 310. Thus, the touch driving circuit 330 may output touch driving signals to the sensor electrodes and may detect voltages that the mutual capacitances of the sensor electrodes are charged with. The sensor electrodes will be described later in detail.

Display circuits of the display panel 300 and a power supply unit configured to supply driving voltages to drive the display driving circuit 320 may be additionally provided on the display circuit board 310. Alternatively, the power supply unit may be integrated into the display driving circuit 320, in which case, the display driving circuit 320 and the power supply unit may be integrally formed as a single IC.

The bendable area BA, which is disposed between the main area MA and the sub-area SA, may be a region where the display panel 300 can be bent. The display panel 300 may be divided into the main area MA, which is disposed on one side of the bendable area BA, and the sub-area SA, which is disposed on the other side of the bendable area BA. The bendable area BA may be connected to one side of the main area MA. For example, the bendable area BA may be connected to the lower short side of the main area MA.

The display panel 300 may be bent with curvature in the bendable area BA in the thickness direction (or the Z-axis direction), particularly, in a direction opposite to the display surface of the display panel 300. The bendable area BA may have a uniform curvature radius or may have a varying curvature radius. When the display panel 300 is bent in the bendable area BA, the sub-area SA may be disposed on the bottom surface of the display panel 300. The sub-area SA may overlap with the main area MA in the third direction (or the Z-axis direction).

Figure 2:
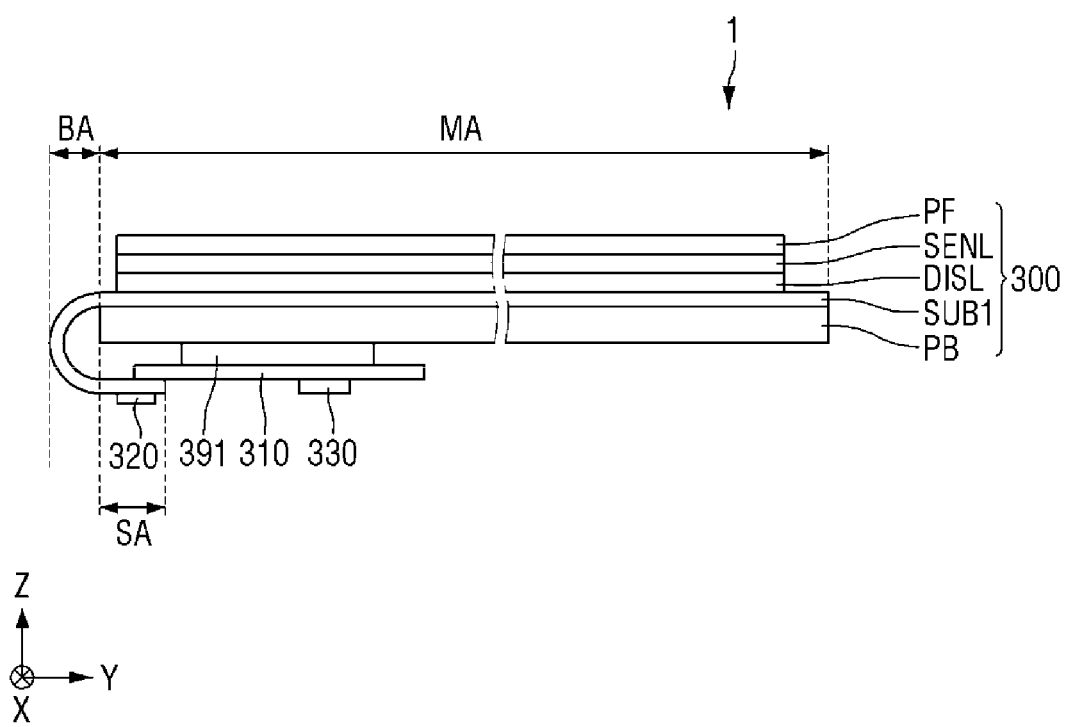
FIG. 2 is a cross-sectional view of the display device of FIG. 1.

FIG. 2 is a cross-sectional view of the display device of FIG. 1.

Referring to FIG. 2, the display panel 300 may include a first substrate SUB1, a display layer DISL, a sensor electrode layer SENL, a polarizing film PF, and a panel bottom cover PB.

The first substrate SUB1 may be formed of an insulating material such as glass, quartz, or a polymer resin. The first substrate SUB1 may be a rigid substrate or a flexible substrate that is bendable, foldable, or rollable.

The display layer DISL may be disposed in the main area MA of the first substrate SUB1. The display layer DISL may be a layer that includes light-emitting regions and displays an image. The display layer DISL may include a thin-film transistor (TFT) layer, in which TFTs are formed, a light-emitting element layer, in which light-emitting elements that emit light are disposed, and an encapsulation layer, which is configured to encapsulate the light-emitting element layer.

Not only the light-emitting regions but also scan lines, data lines, and power supply lines to drive the light-emitting elements may be disposed in the display area DA of the display layer DISL. A scan driving unit, which outputs scan signals to the scan lines, and fan-out lines, which connect the data lines and the display driving circuit 320, may be disposed in the non-display area NDA of the display layer DISL.

The sensor electrode layer SENL may be disposed on the display layer DISL. The sensor electrode layer SENL may include sensor electrodes. The sensor electrode layer SENL may be a layer configured to detect touch input with the use of the sensor electrodes.

The polarizing film PF may be disposed on the sensor electrode layer SENL. The polarizing film PF may include a first base member, a linear polarizing plate, a phase delay film such as a quarter-wave (quarter-wave) plate, and a second base member. The first base member, the phase delay film, the linear polarizing plate, and the second base member may be sequentially stacked on the sensor electrode layer SENL.

A cover window (not illustrated) may be additionally disposed on the polarizing film PF. The cover window OCA may be attached to the polarizing film PF via a transparent adhesive member such as an optically clear adhesive (OCA) film.

The panel bottom cover PB may be disposed below the display panel 300. The panel bottom cover PB may be attached to the bottom surface of the display panel 300 via an adhesive member. The adhesive member may be a pressure sensitive adhesive (PSA). The panel bottom cover PB may include at least one of a light-blocking member configured to absorb light incident from the outside, a buffer member configured to absorb shock from the outside, and a heat dissipation member configured to efficiently release heat from the display panel 300.

The light-blocking member may be disposed below the display panel 300. The light-blocking member blocks the transmission of light and thus prevents elements disposed therebelow such as, for example, the display circuit board 310, from becoming visible from above the display panel 300. The light-blocking member may include a light-absorbing material such as a black pigment or a black dye.

The buffer member may be disposed below the light-blocking member. The buffer member absorbs external shock and thus prevents the display panel 300 from being broken. The buffer member may be formed as a single- or multilayer layer. For example, the buffer member may be formed of a polymer resin such as polyurethane, polycarbonate, polypropylene, or polyethylene or may include an elastic material such as a sponge obtained by foam-molding rubber, a urethane-based material or, an acrylic material.

The heat dissipation member may be disposed below the buffer member. The heat dissipation member may include a first heat dissipation layer, which includes graphite or carbon nanotubes, and a second heat dissipation layer, which can block electromagnetic waves and is formed of a metal with excellent thermal conductivity such as copper, nickel, ferrite, or silver.

When the display panel 300 is bent in the bendable area BA, a sub-area SA of the first substrate SUB1 may be disposed below the display panel 300. The sub-area SA of the first substrate SUB1 may be attached to the bottom surface of the panel bottom cover PB via an adhesive layer 391.

Figure 3:
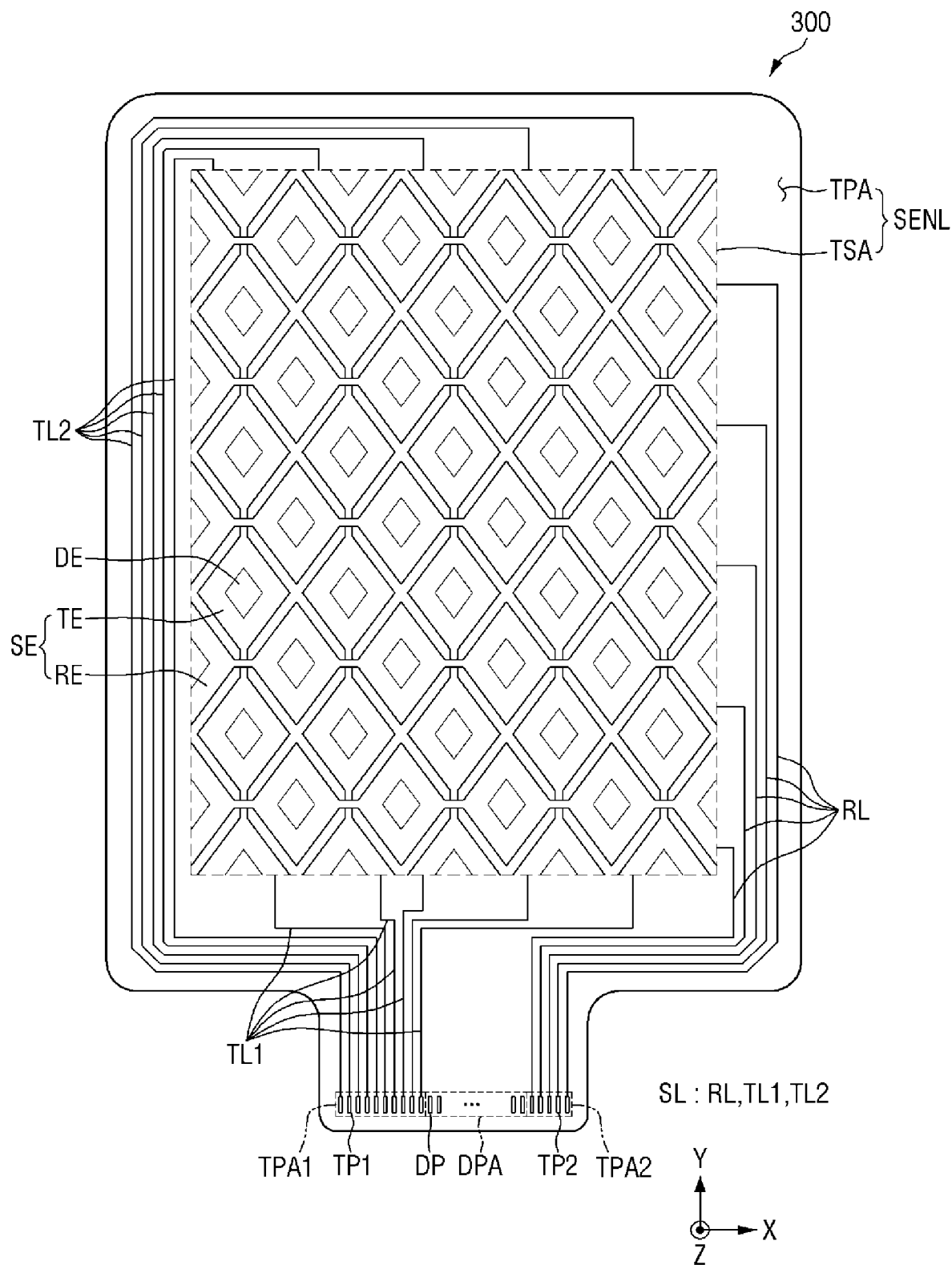
FIG. 3 is a layout view illustrating the configuration of a sensor electrode layer of the display device of FIG. 1.
Figure 4:
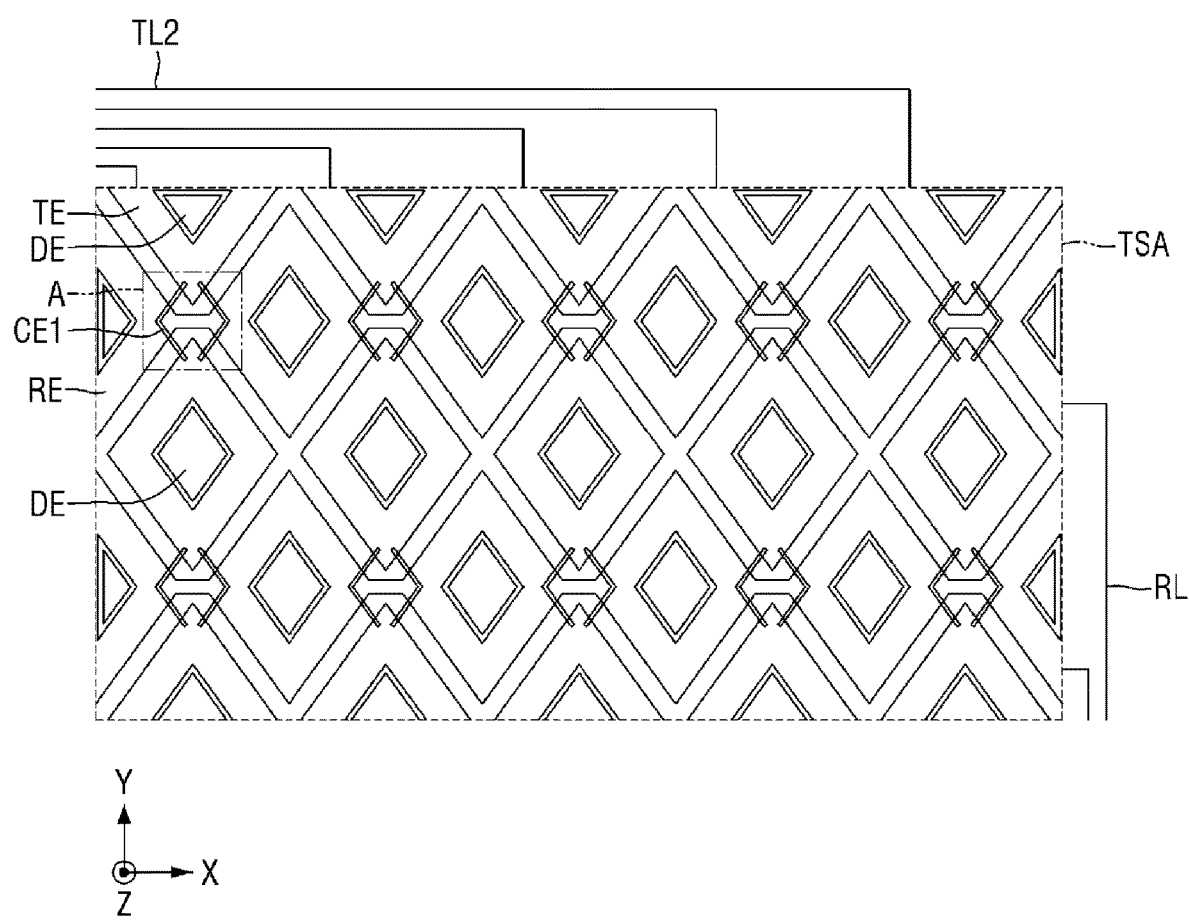
FIG. 4 is a layout view illustrating driving electrodes, sensing electrodes, and dummy electrodes of the display device of FIG. 1.

FIG. 3 is a layout view illustrating the configuration of the sensor electrode layer of the display device of FIG. 1, and FIG. 4 is a layout view illustrating driving electrodes, sensing electrodes, and dummy electrodes of the display device of FIG. 1.

FIGS. 3 and 4 illustrate that sensor electrodes SE of the sensor electrode layer SENL include two types of electrodes, for example, driving electrodes TE and sensing electrodes RE and are driven in a mutual-capacitance manner by applying driving signals to the driving electrodes TE and detecting voltages that the mutual capacitances of the sensing electrodes RE are charged with, but the present disclosure is not limited thereto.

For convenience, FIGS. 3 and 4 illustrate only sensor electrodes (TE and RE), dummy patterns DE, sensor lines (TL1, TL2, and RL), and sensor pads (TP1 and TP2).

Referring to FIGS. 3 and 4, the sensor electrode layer SENL includes a touch sensor area TSA, which is configured to detect touch input from a user, and a touch peripheral area TPA, which is disposed on the periphery of the touch sensor area TSA. The touch sensor area TSA may overlap with the display area DA of the display layer DISL, and the touch peripheral area TPA may overlap with the non-display area NDA of the display layer DISL.

The touch sensor area TSA may include the sensor electrodes SE and dummy patterns DE. The sensor electrodes SE may be electrodes configured to form mutual capacitances to detect an object or touch input from the user.

The sensor electrodes SE may include driving electrodes TE and sensing electrodes RE. For example, the sensing electrodes RE may be defined as first sensor electrodes, and the driving electrodes TE may be defined as second sensor electrodes. In this example, sensing lines RL may be defined as first sensor lines, and first driving lines TL1 and second driving lines TL2 may be defined as second sensor lines. In another example, the driving electrodes TE may be defined as the first sensor electrodes, and the sensing electrodes RE may be defined as the second sensor electrodes. In this example, the first driving lines TL1 and the second driving lines TL2 may be defined as the first sensor lines, and the sensing lines RL may be defined as the second sensor lines.

The sensing electrodes RE may be arranged in parallel to one another in the first direction (or the X-axis direction) and in the second direction (or the Y-axis direction). The sensing electrodes RE may be electrically connected in the first direction (or the X-axis direction). Pairs of adjacent sensing electrodes RE in the first direction (or the X-axis direction) may be connected. Pairs of adjacent sensing electrodes RE in the second direction (or the Y-axis direction) may be electrically isolated.

The driving electrodes TE may be arranged in parallel to one another in the first direction (or the X-axis direction) and in the second direction (or the Y-axis direction). Pairs of adjacent driving electrodes TE in the first direction (or the X-axis direction) may be electrically isolated. Pairs of adjacent driving electrodes TE in the second direction (or the Y-axis direction) may be electrically connected. The pairs of adjacent driving electrodes TE in the second direction (or the Y-axis direction) may be connected via first connecting parts CE1.

The first connecting parts CE1 may be formed to be bent at least once. FIG. 4 illustrates that each of the first connecting parts CE1 is formed in the shape of an angle bracket (such as "<" or ">"), but the planar shape of the first connecting parts CE1 is not particularly limited. Because the pairs of adjacent driving electrodes TE in the second direction (or the Y-axis direction) are connected by multiple first connecting parts CE1, the driving electrodes TE can be stably connected in the second direction (or the Y-axis direction), even if one of the first connecting parts CE1 is disconnected. FIG. 4 illustrates that two adjacent driving electrodes TE are connected by one connecting part CE1, but the number of connecting parts CE1 is not particularly limited.

Due to the presence of the first connecting parts CE1, the driving electrodes TE and the sensing electrodes RE can be electrically isolated at the intersections therebetween. As a result, mutual capacitances can be formed between the driving electrodes TE and the sensing electrodes RE.

The dummy patterns DE may be surrounded by the driving electrodes or the sensing electrodes RE. The dummy patterns DE may be electrically isolated from the driving electrodes TE or the sensing electrodes RE. The dummy patterns DE may be spaced apart from the driving electrodes TE or the sensing electrodes RE. The dummy patterns DE may be electrically floated.

The length, in the first direction (or the X-axis direction), of the driving electrodes TE and the length, in the second direction (or the Y-axis direction), of the driving electrodes TE may be about 3 mm to 5 mm. The length, in the first direction (or the X-axis direction), of the driving electrodes TE refers to the distance from the left end to the right end of each of the driving electrodes TE. The length, in the second direction (or the Y-axis direction), of the driving electrodes TE refers to the distance from the upper end to the lower end of each of the driving electrodes TE. The length, in the first direction (or the X-axis direction), of the sensing electrodes RE and the length, in the second direction (or the Y-axis direction), of the sensing electrodes RE may be about 3 mm to 5 mm.

FIG. 3 illustrates that the driving electrodes TE, the sensing electrodes RE, and the dummy patterns DE have a rhombus shape in a plan view, but the present disclosure is not limited thereto. Alternatively, the driving electrodes TE, the sensing electrodes RE, and the dummy patterns DE may have various other shapes such as a rectangular shape other than a rhombus shape, a polygonal shape other than a rectangular shape, a circular shape, or an elliptical shape in a plan view.

The sensor lines (TL1, TL2, and RL) may be disposed in the touch peripheral area TPA. The sensor lines (TL1, TL2, and RL) may include the sensing lines RL, which are connected to the sensing electrodes RE, and the first driving lines TL1 and the second driving lines TL2, which are connected to the driving electrodes TE. The sensing lines RL may be defined as the first sensor lines, and the first driving lines TL1 and the second driving lines TL2 may be defined as the second sensor lines.

Sensing electrodes RE disposed on one side of the touch sensor area TSA may be connected one-to-one to the sensing lines RL. For example, referring to FIG. 3, sensing electrodes RE that are electrically connected in the first direction (or the X-axis direction) at the right end of the touch sensor area TSA may be connected to the sensing lines RL. The sensing lines RL may be connected one-to-one to second sensor pads TP2. Accordingly, the touch driving circuit 330 can be electrically connected to the sensing electrodes RE.

Driving electrodes TE disposed on one side of the touch sensor area TSA may be connected one-to-one to the first driving lines TL1, and driving electrodes TE disposed on the other side of the touch sensor area TSA may be connected one-to-one to the second driving lines TL2. For example, referring to FIG. 3, driving electrodes TE disposed at the lower end of the touch sensing area TSA may be connected to the first driving line TL1, and driving electrodes TE disposed at the upper end of the touch sensing area TSA may be connected to the second driving line TL2. The second driving lines TL2 may be connected to the driving electrodes TE on the upper side of the touch sensor area TSA via the outer left side of the touch sensor area TSA.

The first driving lines TL1 and the second driving lines TL2 may be connected one-to-one to first sensor pads TP1. Accordingly, the touch driving circuit 330 can be electrically connected to the driving electrodes TE. Because the driving electrodes TE are connected to driving lines (TL1 and TL2) on either side of the touch sensor area TSA and thus receive touch driving signals, differences can be prevented from being generated between touch driving signals applied to driving electrodes TE disposed on a lower side of the touch sensor area TSA and touch driving signals applied to driving electrodes TE disposed on an upper side of the touch sensor area TSA.

A first sensor pad area TPA1 where the first sensor pads TP1 are disposed may be provided on one side of a display pad area DPA where display pads DP are disposed. A second sensor pad area TPA2 where the second sensor pads TP2 are disposed may be provided on the other side of the display pad area DPA. The display pads DP may be connected to data lines of the display panel 300.

The display pad area DPA, the first sensor pad area TPA1, and the second sensor pad area TPA2 may be disposed on the lower side of the display panel 300. The display circuit board 310 may be disposed on the display pads DP, the first sensor pads TP1, and the second sensor pads TP2, as illustrated in FIG. 1. The display pads DP, the first sensor pads TP1, and the second sensor pads DP2 may be electrically connected to the display circuit board 310 via a low-resistance, high-reliability material such as an ACF or an SAP. Accordingly, the display pad area DPA, the first sensor pad area TPA1, and the second sensor pad area TPA2 can be electrically connected to the touch driving circuit 330, which is disposed on the display circuit board 310.

As illustrated in FIGS. 3 and 4, the touch sensor area TSA may include the driving electrodes TE and the sensing electrodes RE. Accordingly, the presence of an object or touch input from the user can be detected using mutual capacitances between the driving electrodes TE and the sensing electrodes RE.

Figure 5:
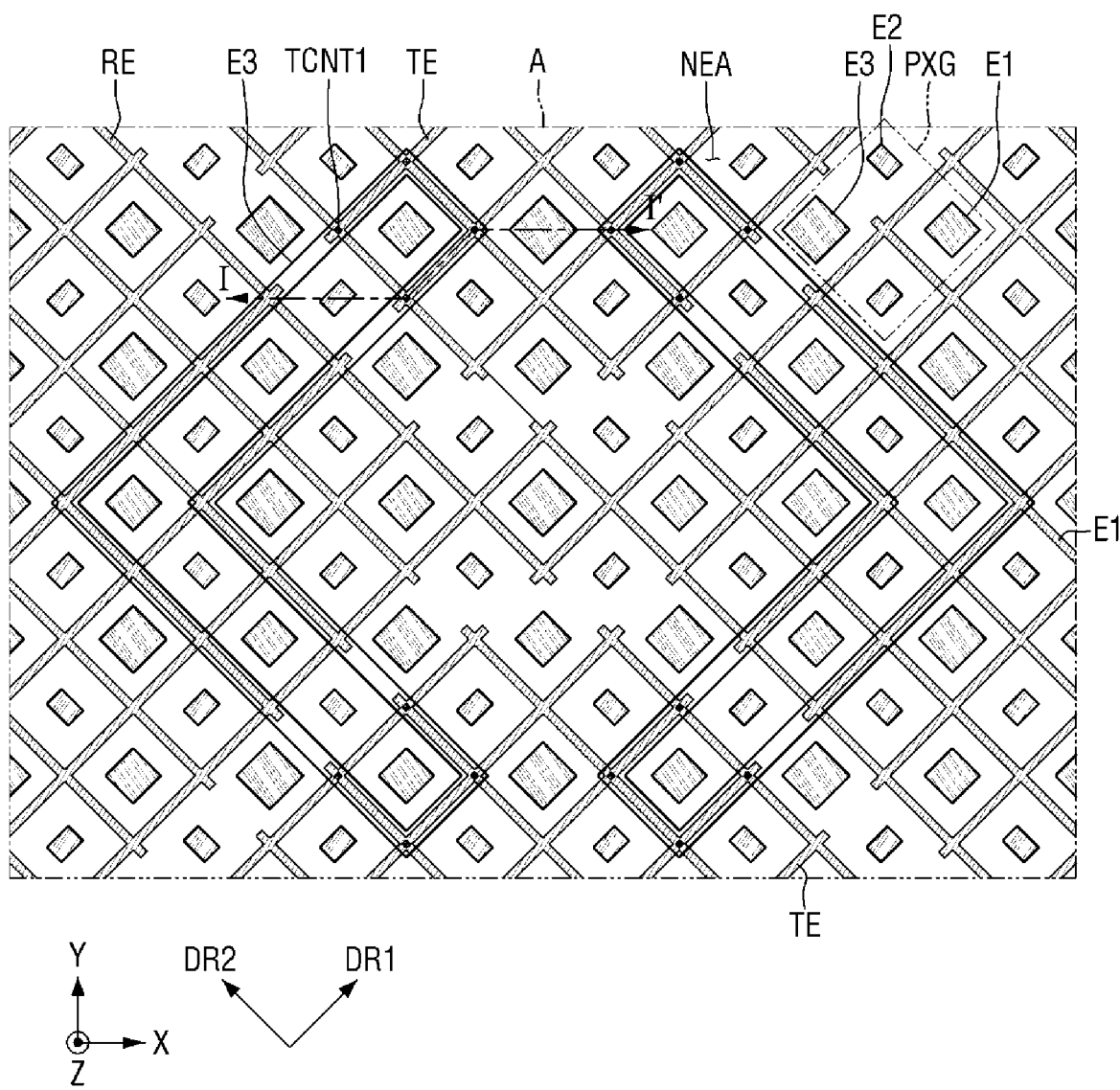
FIG. 5 is a detailed layout view illustrating the driving electrodes and the sensing electrodes of FIG. 4 and first connecting parts.

FIG. 5 is a detailed layout view illustrating the driving electrodes and the sensing electrodes of FIG. 4 and first connecting parts. Specifically, FIG. 5 is a detailed layout view of an area A of FIG. 4.

Referring to FIG. 5, the driving electrodes TE, the sensing electrodes RE, and the dummy patterns DE may be disposed in the same layer to be spaced apart from one another. That is, gaps may be formed between the driving electrodes TE and the sensing electrodes RE. Also, gaps may be formed between the driving electrodes TE and the dummy patterns DE and between the sensing electrodes RE and the dummy patterns DE.

The first connecting parts CE1 may be disposed in a different layer from the driving electrodes TE and the sensing electrodes RE. The first connecting parts CE1 may overlap, in the third direction (or the Z-axis direction) with their respective pairs of adjacent driving electrodes TE in the second direction (or the Y-axis direction). The first connecting parts CE1 may overlap with the sensing electrodes RE in the third direction (or the Z-axis direction). One side of each of the first connecting parts CE1 may be connected to one of a pair of adjacent driving electrodes TE in the second direction (or the Y-axis direction), via a first touch contact hole TCNT1, and the other side of each of the first connecting parts CE1 may be connected to the other driving electrode TE via another first touch contact hole TCNT1.

The driving electrodes TE, the sensing electrodes RE, and the first connecting parts CE1 may be formed in a mesh or fishnet structure in a plan view. Also, the dummy patterns DE may be formed in a mesh or fishnet structure in a plan view. Accordingly, the driving electrodes TE, the sensing electrodes RE, the first connecting parts CE1, and the dummy patterns DE may not overlap with emission areas (E1, E2, and E3). Thus, the luminance of light emitted from the emission areas (E1, E2, and E3) can be prevented from decreasing because of being blocked by the driving electrodes TE, the sensing electrodes, the first connecting parts CE1, and the dummy patterns DE.

Alternatively, the driving electrodes TE, the sensing electrodes RE, the first connecting parts CE1, and the dummy patterns DE may be formed as surfaces, rather than in a mesh or fishnet structure, in a plan view. In order to prevent the luminance of light emitted from the emission areas (E1, E2, and E3) from decreasing because of being blocked by the driving electrodes TE, the sensing electrodes, the first connecting parts CE1, and the dummy patterns DE, the driving electrodes TE, the sensing electrodes, the first connecting parts CE1, and the dummy patterns DE may be formed of a transparent conductive material such as indium tin oxide (ITO) or indium zinc oxide (IZO).

The emission areas (E1, E2, and E3) may include first emission areas E1, which emit light of a first color, second emission areas E2, which emit light of a second color, and third emission areas E3, which emit light of a third color. For example, the first color may be red, the second color may be green, and the third color may be blue.

The first emission areas E1, the second emission areas E2, and the third emission areas E3 may have a rhombus or rectangular shape in a plan view, but the present disclosure is not limited thereto. Alternatively, the first emission areas E1, the second emission areas E2, and the third emission areas E3 may have various other shapes such as a polygonal shape other than a rectangular shape, a circular shape, or an elliptical shape in a plan view. FIG. 5 illustrates that the third emission areas E3 have a largest size and the second emission areas E2 have a smallest size, but the present disclosure is not limited thereto.

One first emission area E1, two second emission areas E2, and one third emission area E3 may be defined as a pixel emission group PXG configured to represent white gradation. That is, white gradation can be represented by light emitted from one first emission area E1, light emitted from two second emission areas E2, and light emitted from one third emission area E3.

The second emission areas E2 may be arranged in odd-numbered rows. The second emission areas E2 may be arranged side-by-side in the first direction (or the X-axis direction) in the odd-numbered rows. In each of the odd-numbered rows, one of each pair of adjacent second emission areas E2 in the first direction (or the X-axis direction) may have long sides in a first direction DR1 and short sides in a second direction DR2, but the other of each pair of adjacent second emission areas E2 in the first direction (or the X-axis direction) may have long sides in the second direction DR2 and short sides in the first direction DR1. The first direction DR1 may be a direction between the first direction (or the X-axis direction) and the second direction (or the Y-axis direction), and the second direction DR2 may be a direction that intersects the first direction DR1.

The first emission areas E1 and the third emission areas E3 may be arranged in even-numbered rows. The first emission areas E1 and the third emission areas E3 may be arranged side-by-side in the first direction (or the X-axis direction) in the even-numbered rows. The first emission areas E1 and the third emission areas E3 may be alternately arranged in the even-numbered rows.

The second emission areas E2 may be arranged in odd-numbered columns. The second emission areas E2 may be arranged side-by-side in the second direction (or the Y-axis direction) in the odd-numbered columns. In each of the odd-numbered columns, one of each pair of adjacent second emission areas E2 in the second direction (or the Y-axis direction) may have long sides in the first direction DR1 and short sides in the second direction DR2, but the other of each pair of adjacent second emission areas E2 in the first direction (or the X-axis direction) may have long sides in the second direction DR2 and short sides in the first direction DR1.

The first emission areas E1 and the third emission areas E3 may be arranged in even-numbered columns. The first emission areas E1 and the third emission areas E3 may be arranged side-by-side in the even-numbered columns. The first emission areas E1 and the third emission areas E3 may be alternately arranged in the even-numbered columns.

Figure 6:
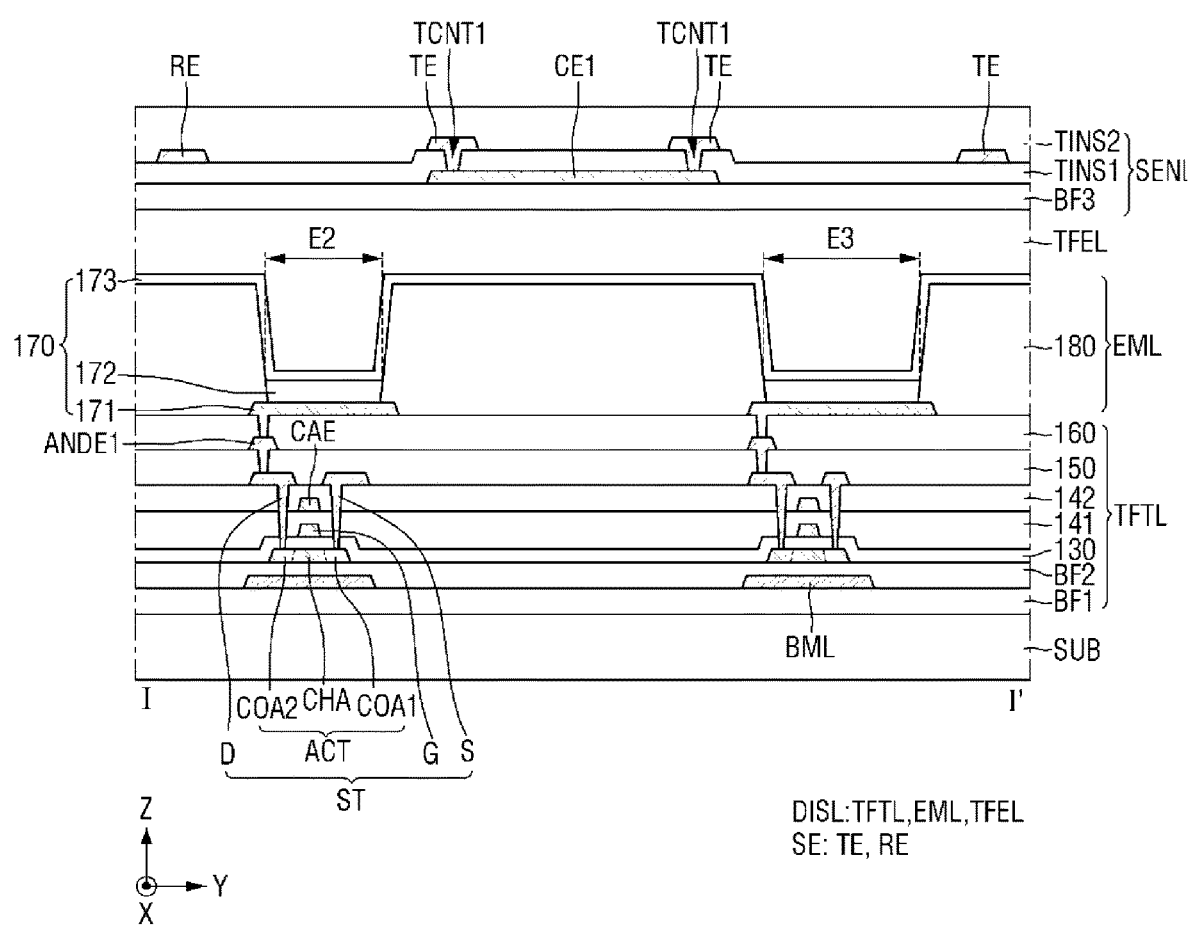
FIG. 6 is a cross-sectional view taken along line I-I' of FIG. 5.

FIG. 6 is a cross-sectional view taken along line I-I' of FIG. 5.

Referring to FIG. 6, the display layer DISL, which includes a TFT layer TFTL, a light-emitting element layer EML, and an encapsulation layer TFEL, may be disposed on a substrate SUB, and the sensor electrode layer SENL, which includes the sensor electrodes SE, may be disposed on the display layer DISL.

A first buffer layer BF1 may be disposed on a first surface of the substrate SUB, and a second buffer layer BF2 may be disposed on the first buffer layer BF1. The first and second buffer layers BF1 and BF2 may be disposed on the first surface of the substrate SUB to protect TFTs ST of the TFT layer TFTL and a light-emitting layer 172 of the light-emitting element layer EML from moisture that may penetrate through the substrate SUB that is susceptible to moisture. Each of the first and second buffer layers BF1 and BF2 may include a plurality of inorganic layers that are alternately stacked. For example, each of the first and second buffer layers BF1 and BF2 may be formed as a multilayer layer in which one or more inorganic layer selected from among a silicon nitride layer, a silicon oxynitride layer, a silicon oxide layer, a titanium oxide layer, and an aluminum oxide layer are alternately stacked. One of the first and second buffer layers BF1 and BF2 may not be provided.

First light-blocking layers BML may be disposed on the first buffer layer BF1. The first light-blocking layers BML may be formed as a single- or multilayer layer including molybdenum (Mo), aluminum (Al), chromium (Cr), gold (Au), titanium (Ti), nickel (Ni), neodymium (Nd), copper (Cu), or an alloy thereof. Alternatively, the first light-blocking layers BML may be an organic layer including a black pigment.

Active layers ACT of the TFTs ST may be disposed on the second buffer layer BF2. The active layers ACT may include polycrystalline silicon, monocrystalline silicon, low-temperature polycrystalline silicon (LTPS), amorphous silicon, or an oxide semiconductor material. In a case where the active layers ACT include polycrystalline silicon or an oxide semiconductor material, ion doped regions of the active layers ACT may be conductive areas with conductivity.

The active layers ACT may overlap with the first light-blocking layers BML in the third direction (or the Z-axis direction). Because light incident through the substrate SUB can be blocked by the first light-blocking layers BML, leakage currents can be prevented from flowing into the active layers ACT due to the incident light.

A gate insulating layer 130 may be formed on the active layers ACT. The gate insulating layer 130 may be formed as an inorganic layer such as, for example, a silicon nitride layer, a silicon oxynitride layer, a silicon oxide layer, a titanium oxide layer, or an aluminum oxide layer.

Gate electrodes G of the TFTs ST may be disposed on the gate insulating layer 130. The gate electrodes G of the TFTs ST may overlap with the active layers ACT in the third direction (or the Z-axis direction). Parts of the active layers ACT that overlap with the gate electrodes G in the third direction (or the Z-axis direction) may be channel areas CHA. The gate electrodes G may be formed as single- or multilayer layers including Mo, Al, Cr, Au, Ti, Ni, Nd, Cu, or an alloy thereof.

A first interlayer insulating layer 141 may be disposed on the gate electrodes G. The first interlayer insulating layer 141 may be formed as an inorganic layer such as, for example, a silicon nitride layer, a silicon oxynitride layer, a silicon oxide layer, a titanium oxide layer, or an aluminum oxide layer. The first interlayer insulating layer 141 may include a plurality of inorganic layers.

Capacitor electrodes CAE may be disposed on the first interlayer insulating layer 141. The capacitor electrodes CAE may overlap with the gate electrodes G in the third direction (or the Z-axis direction). The capacitor electrodes CAE may be formed as single- or multilayer layers including Mo, Al, Cr, Au, Ti, Ni, Nd, Cu, or an alloy thereof.

A second interlayer insulating layer 142 may be disposed on the capacitor electrodes CAE. The second interlayer insulating layer 142 may be formed as an inorganic layer such as, for example, a silicon nitride layer, a silicon oxynitride layer, a silicon oxide layer, a titanium oxide layer, or an aluminum oxide layer. The second interlayer insulating layer 142 may include a plurality of inorganic layers.

First electrodes S and second electrodes D of the TFTs ST may be disposed on the second interlayer insulating layer 142. The first electrodes S and the second electrodes D may be formed as single- or multilayer layers including Mo, Al, Cr, Au, Ti, Ni, Nd, Cu, or an alloy thereof.

The first electrodes S of the TFTs ST may be connected to first conductive areas COA1, which are disposed on first sides of the channel areas CHA of the active layers ACT, through contact holes that penetrate the gate insulating layer 130, the first interlayer insulating layer 141, and the second interlayer insulating layer 142. The second electrodes D of the TFTs ST may be connected to second conductive areas COA2, which are disposed on second sides of the channel areas CHA of the active layers ACT, through contact holes that penetrate the gate insulating layer 130, the first interlayer insulating layer 141, and the second interlayer insulating layer 142.

A first organic layer 150 configured to planarize height differences formed by the TFTs ST may be disposed on the first electrodes S and the second electrodes D. The first organic layer 150 may be formed as an organic layer including an acrylic resin, an epoxy resin, a phenolic resin, a polyamide resin, or a polyimide resin.

First connecting electrodes ANDE1 may be disposed on the first organic layer 150. The first connecting electrodes ANDE1 may be connected to the second electrodes D of the TFTs ST through contact holes that penetrate the first organic layer 150. The first connecting electrodes ANDE1 may be formed as single- or multilayer layers including Mo, Al, Cr, Au, Ti, Ni, Nd, Cu, or an alloy thereof.

A second organic layer 160 may be disposed on the first connecting electrodes ANDE1. The second organic layer 160 may be formed as an organic layer including an acrylic resin, an epoxy resin, a phenolic resin, a polyamide resin, or a polyimide resin.

FIG. 6 illustrates that the TFTs ST are formed as top gate TFTs where the gate electrodes G are disposed above the active layers ACT, but the present disclosure is not limited thereto. Alternatively, the TFTs ST may be formed as bottom gate TFTs where the gate electrodes G are disposed below the active layers ACT or as double gate TFTs where the gate electrodes G are disposed both above and below the active layers ACT.

The light-emitting element layer EML is disposed on the TFT layer TFTL. The light-emitting element layer EML may include light-emitting elements 170 and a third organic layer 180.

Each of the light-emitting elements 170 may include a first light-emitting element 171, a light-emitting layer 172, and a second light-emitting electrode 173. Each of the second emission areas E2 and the third emission areas E3 may be a region in which the first light-emitting electrode 171, the light-emitting layer 172, and the second light-emitting electrode 173 are sequentially stacked so that holes from the first light-emitting element 171 and electrons from the second light-emitting electrode 173 can combine in the light-emitting layer 172 to emit light. In this case, the first light-emitting electrode 171 may be an anode electrode, and the second light-emitting electrode 173 may be a cathode electrode.

First light-emitting electrodes 171 may be formed on the second organic layer 160. The first light-emitting electrodes 171 may be connected to the first connecting electrodes ANDE1 via contact holes that penetrate the second organic layer 160.

In a top emission structure in which the light-emitting elements 170 emit light in a direction from the light-emitting layers 172 to the second light-emitting electrode 173 of the light-emitting elements 170, the first light-emitting electrodes 171 may be formed as single layers of Mo, Ti, Cu, or Al or may be formed as stacks of Al and Ti (e.g., Ti/Al/Ti), stacks of Al and ITO (e.g., ITO/Al/ITO), layers of a silver (Ag)-palladium (Pd)-copper (Cu) (APC) alloy, or stacks of an APC alloy and ITO (e.g., ITO/APC/ITO).

A third organic layer 180 defines the second emission areas E2 and the third emission areas E3. The third emission layer E3 may be larger than the second emission layer E2 in the Y direction, but embodiments are not limited thereto. To this end, the third organic layer 180 may be formed on the second organic layer 160 to expose parts of the first light-emitting electrodes 171 of the light-emitting elements 170. The third organic layer 180 may cover the edges of each of the first light-emitting electrodes 170. The third organic layer 180 may be formed as an organic layer including an acrylic resin, an epoxy resin, a phenolic resin, a polyamide resin, or a polyimide resin.

Light-emitting layers 172 are formed on the first light-emitting electrodes 171. The light-emitting layers 172 may include an organic material to emit light of a predetermined color. For example, the light-emitting layers 172 may each include a hole transport layer, an organic material layer, and an electro transport layer. In this example, the organic material layer may include a host and a dopant. The organic material layer may include a material capable of emitting light of a predetermined color and may be formed of a phosphorescent material or a fluorescent material.

For example, the organic material layers of light-emitting layers 172 formed in the first emission areas E1 (of FIG. 5), which emit light of the first color, may be formed of a phosphorescent material including a host material containing carbazole biphenyl (CBP) or 1,3-bis(carbazol-9-yl)benzene (mCP) and at least one dopant material selected from among bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and platinum octaethylporphyrin (PtOEP). In another example, the organic material layers of light-emitting layers 172 formed in the first emission areas E1 (of FIG. 5) may be formed of a fluorescent material including PBD:Eu(DBM) 3(Phen) or perylene. However, the present disclosure is not limited to these examples.

For example, the organic material layers of light-emitting layers 172 formed in the second emission areas E2, which emit light of the second color, may be formed of a phosphorescent material including a host material containing CBP or mCP and a dopant material containing fac-tris(2-phenylpyridine)iridium) (Ir(ppy)3). In another material, the organic material layers of the light-emitting layers 172 formed in the second emission areas E2 may be formed of a fluorescent material including tris(8-hydroxyquinolino) aluminum (Alq3). However, the present disclosure is not limited to these examples.

For example, the organic material layers of light-emitting layers 172 formed in the third emission areas E3, which emit light of the third color, may be formed of a phosphorescent material including a host material containing CBP or mCP and a dopant material containing (4,6-F2ppy)2Irpic or L2BD111. However, the present disclosure is not limited to this example.

A second light-emitting electrode 173 may be formed on the light-emitting layers 172. The second light-emitting electrode 173 may be formed to cover the light-emitting layers 172. The second light-emitting electrode 173 may be a common layer formed in common for all display pixels. A capping layer may be formed on the second light-emitting electrode 173.

In the top emission structure, the second light-emitting electrode 173 may be formed of a transparent conductive oxide (TCO) material such as ITO or IZO or a translucent metallic material such as magnesium (Mg), Ag, or an alloy thereof. In a case where the second light-emitting electrode 13 is formed of a translucent metallic material, the emission efficiency of the light-emitting elements 170 can be improved due to micro-cavities.

The light-emitting layers 172 may be disposed on the top surfaces of the first light-emitting electrodes 171 and on inclined surfaces of the third organic layer 180. The second light-emitting electrodes 173 may be disposed on the top surfaces of the light-emitting layers 172 and on the inclined surfaces of the third organic layer 180.

The encapsulation layer TFEL may be formed on the light-emitting element layer EML. The encapsulation layer TFEL may include at least one inorganic layer to prevent the penetration of oxygen or moisture into the light-emitting element layer EML. The encapsulation layer TFEL may also include at least one organic layer to protect the light-emitting element layer EML from foreign materials such as dust. The inorganic layer may be formed as a multilayer layer in which one or more inorganic layers selected from among a silicon nitride layer, a silicon oxynitride layer, a silicon oxide layer, a titanium oxide layer, and an aluminum oxide layer are alternately stacked. The organic layer may be formed of an acrylic resin, an epoxy resin, a phenolic resin, a polyamide resin, or a polyimide resin.

The sensor electrode layer SENL is disposed on the encapsulation layer TFEL. The sensor electrode layer SENL may include the sensor electrodes SE.

A third buffer layer BF3 may be disposed on the encapsulation layer TFEL. The third buffer layer BF3 may be a layer having insulation and optical functions. The third buffer layer BF3 may include at least one inorganic layer. For example, the third buffer layer BF3 may be formed as a multilayer layer in which one or more inorganic layers selected from among a silicon nitride layer, a silicon oxynitride layer, a silicon oxide layer, a titanium oxide layer, and an aluminum oxide layer are alternately stacked. The third buffer layer BF3 may be formed by a lamination process using a flexible material, a spin coating process using a solution-type material, a slit die coating process, or a deposition process. The third buffer layer BF3 may not be provided.

The first connecting parts CE1 may be disposed on the third buffer layer BF3. The first connecting parts CE1 may be formed as single layers of Mo, Ti, Cu, or Al or may be formed as stacks of Al and Ti (e.g., Ti/Al/Ti), stacks of Al and ITO (e.g., ITO/Al/ITO), layers of an APC alloy, or stacks of an APC alloy and ITO (e.g., ITO/APC/ITO).

A first sensor insulating layer TINS1 may be disposed on the first connecting parts CE1. The first sensor insulating layer TINS1 may be a layer having insulation and optical functions. The first sensor insulating layer TINS1 may be formed as an inorganic layer such as, for example, a silicon nitride layer, a silicon oxynitride layer, a silicon oxide layer, a titanium oxide layer, or an aluminum oxide layer. The first sensor insulating layer TINS1 may be formed by a lamination process using a flexible material, a spin coating process using a solution-type material, a slit die coating process, or a deposition process.

The driving electrodes TE and the sensing electrodes RE may be disposed on the first sensor insulating layer TINS1.

The driving electrodes TE and the sensing electrodes RE may not overlap with the second emission areas E2 and the third emission areas E3. The driving electrodes TE and the sensing electrodes RE may be formed as single layers of Mo, Ti, Cu, or Al or may be formed as stacks of Al and Ti (e.g., Ti/Al/Ti), stacks of Al and ITO (e.g., ITO/Al/ITO), layers of an APC alloy, or stacks of an APC alloy and ITO (e.g., ITO/APC/ITO).

A second sensor insulating layer TINS2 may be disposed on the driving electrodes TE and the sensing electrodes RE. The second sensor insulating layer TINS2 may be a layer having insulation and optical functions. The second sensor insulating layer TINS2 may include at least one of an inorganic layer and an organic layer. The inorganic layer may be a silicon nitride layer, a silicon oxynitride layer, a silicon oxide layer, a titanium oxide layer, or an aluminum oxide layer. The organic layer may be formed of an acrylic resin, an epoxy resin, a phenolic resin, a polyamide resin, or a polyimide resin. The second sensor insulating layer TINS2 may be formed by a lamination process using a flexible material, a spin coating process using a solution-type material, a slit die coating process, or a deposition process. Referring to FIG. 6, the driving electrodes TE and the sensing electrodes RE may be disposed in the same layer and may be formed of the same material at the same time.

Figure 7:
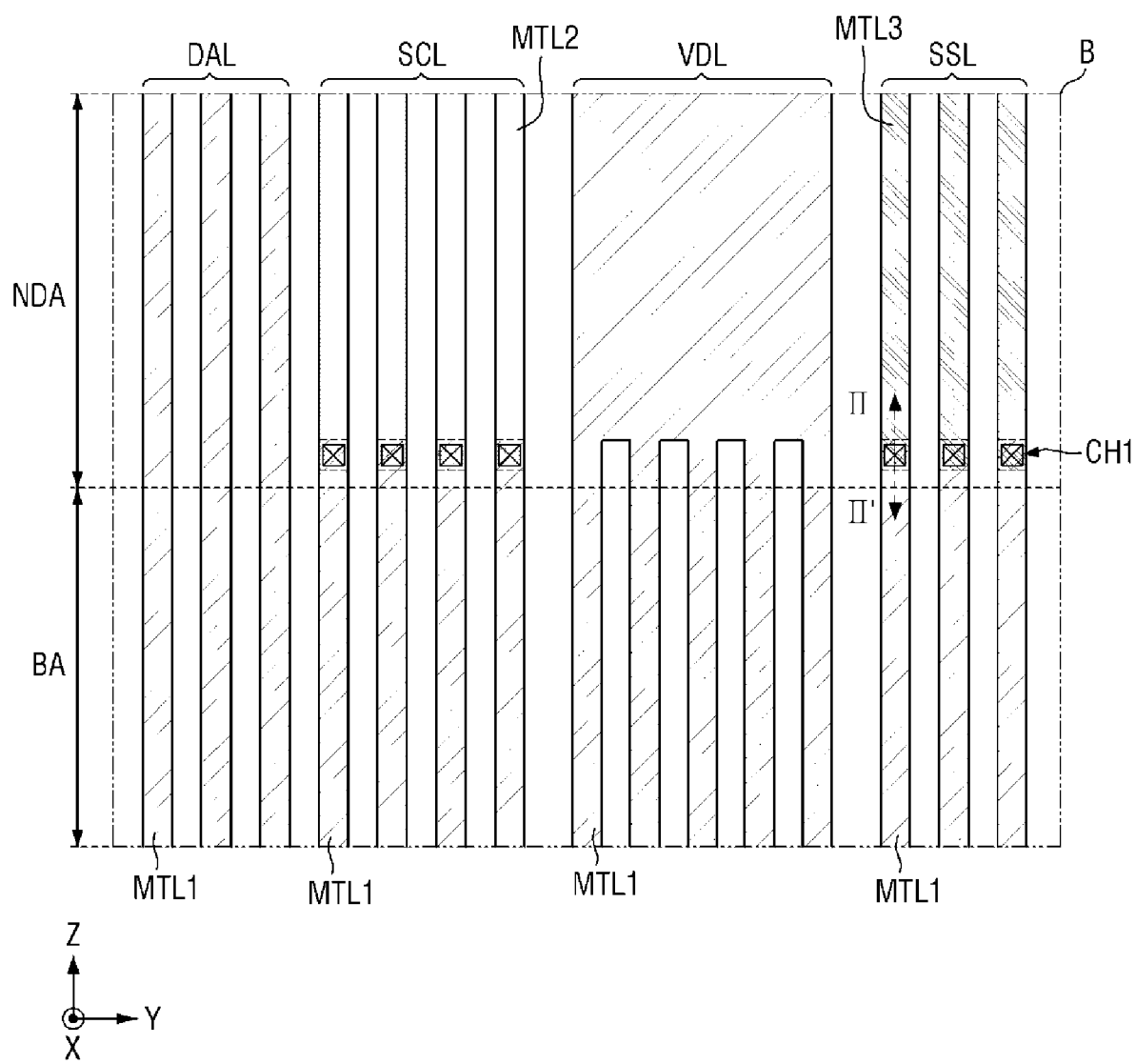
FIG. 7 is a layout view illustrating wires in a non-display area and a bendable area of the display device of FIG. 1.
Figure 8:
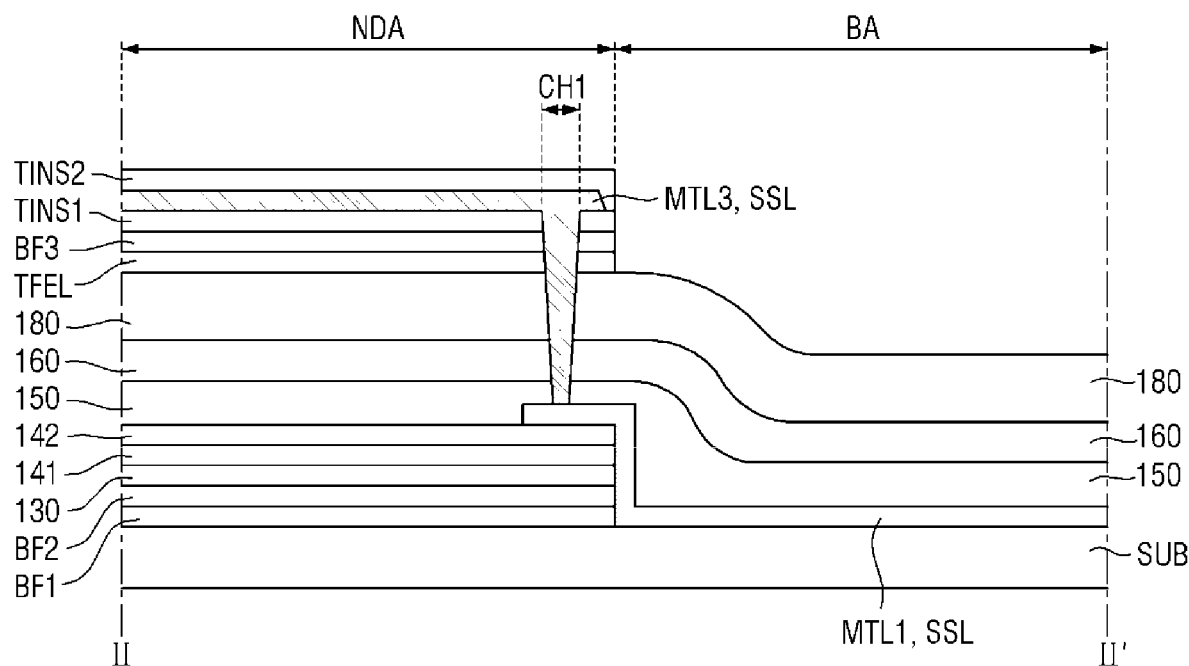
FIG. 8 is a cross-sectional view taken along line II-II' of FIG. 7.

FIG. 7 is a layout view illustrating wires in the non-display area and the bendable area of the display device of FIG. 1. Specifically, FIG. 7 is a layout view of an area B of FIG. 1. FIG. 8 is a cross-sectional view taken along line II-II' of FIG. 7.

Referring to FIG. 7, data lines DAL, scan lines SCL, power supply lines VDL, and sensor wires SSL, which extend from the display area DA of FIG. 1, may be disposed in the non-display area NDA and the bendable area BA. The display area DA may be disposed in the second direction (or the Y-axis direction) from the non-display area NDA.

Specifically, the data lines DAL may be connected to first electrodes or second electrodes of first TFTs of pixels in the display area DA. The scan lines SCL may be connected to gate electrodes of the first TFTs. The power supply lines VDL may be connected to first electrodes or second electrodes of second TFTs of the pixels to supply power. Alternatively, the power supply lines VDL may be connected to second light-emitting electrodes of the pixels to supply power. The sensor wires SSL may include the sensor lines (TL1, TL2, and RL) of FIG. 3. The sensor wires SSL may be connected to the driving electrodes TE or the sensing electrodes RE.

FIG. 7 illustrates parts of the non-display area NDA and the bendable area BA of FIG. 1, but the data lines DAL, the scan lines SCL, the power supply lines VDL, and the sensor wires SSL may also be disposed in other parts of the non-display area NDA and the bendable area BA.

The data lines DAL and the power lines VDL may be formed of a first metal layer MTL1. The first metal layer MTL1 may be formed of the same material as the first electrodes S of the TFTs ST of FIG. 6. The data lines DAL and the power supply lines VDL may be disposed on the same layer as the first electrodes S of the TFTs ST. The first metal layer MTL1 may be formed as a single- or multilayer layer including Mo, Al, Cr, Au, Ti, Ni, Nd, Cu, or an alloy thereof.

The data lines DAL and the power supply lines VDL may be formed of the first metal layer MTL1, in the non-display area NDA and the bendable area BA. That is, the data lines DAL and the power supply lines VDL may be formed of the first metal layer MTL1 in the non-display area NDA and the bendable area BA, rather than being jumped or connected to another layer.

The scan lines SCL may be formed of a second metal layer MTL2, in the non-display area NDA. The second metal layer MTL2 may be formed of the same material as the gate electrodes G of the TFTs ST of FIG. 6. The scan lines SCL may be disposed on the same layer as the gate electrodes G of the TFTs ST, in the non-display area NDA. The second metal layer MTL2 may be formed as a single- or multilayer layer including Mo, Al, Cr, Au, Ti, Ni, Nd, Cu, or an alloy thereof.

The scan lines SCL may be formed of the first metal layer MTL1, in the bendable area BA. The scan lines SCL may be jumped from the second metal layer MTL2 to the first metal layer MTL1 through contact holes, in a portion of the non-display area NDA adjacent to the bendable area BA.

The sensor wires SSL may be formed of a third metal layer MTL3, in the non-display area NDA. The third metal layer MTL3 may be formed of the same material as the driving electrodes TE of the sensor electrode layer SENL of FIG. 6, in which case, the sensor wires SSL may be disposed on the same layer as the driving electrodes TE of the sensor electrode layer SENL, in the non-display area NDA. Alternatively, the third metal layer MTL3 may be formed of the same material as the sensing electrodes RE of the sensor electrode layer SENL, in which case, the sensor wires SSL may be disposed on the same layer as the sensing electrodes RE of the sensor electrode layer SENL, in the non-display area NDA. The sensor wires SSL, which consists of the third metal layer MTL3, will hereinafter be described as being formed of the same material, and disposed on the same layer, as the driving electrodes TE of the sensor electrode layer SENL, but the present disclosure is not limited thereto.

The third metal layer MTL3 may be formed as a single layer of Mo, Ti, Cu, or Al or may be formed as a stack of Al and Ti (e.g., Ti/Al/Ti), a stack of Al and ITO (e.g., ITO/Al/ITO), a layer of an APC alloy, or a stack of an APC alloy and ITO (e.g., ITO/APC/ITO).

The sensor wires SSL may be formed of the first metal layer MTL1, in the bendable area BA. The sensor wires SSL may be jumped from the third metal layer MTL3 to the first metal layer MTL1 through first contact holes CH1, in the portion of the non-display area NDA adjacent to the bendable area BA. The first metal layer MTL1 that the sensor wires SSL are formed of may be disposed in the non-display area NDA and the bendable area BA.

In one embodiment, the first metal layer MTL1 may be formed as a stack of Al and Ti, particularly, a Ti/Al/Ti stack. A Ti/Al/Ti stack does not crack when the substrate SUB is bent, and is thus highly reliable. Accordingly, because the wires disposed in the bendable area BA are formed of the first metal layer MTL1, which has a Ti/Al/Ti stack structure, wires can be prevented from cracking.

Referring to FIG. 8, the non-display area NDA and the bendable area BA may be defined on the substrate SUB.

The first buffer layer BF1, the second buffer layer BF2, the gate insulating layer 130, the first interlayer insulating layer 141, and the second interlayer insulating layer 142 may be sequentially stacked in the non-display area NDA. The first buffer layer BF1, the second buffer layer BF2, the gate insulating layer 130, the first interlayer insulating layer 141, and the second interlayer insulating layer 142 may not overlap with the bendable area BA. The first metal layer MTL1 may be disposed on the second interlayer insulating layer 142. The first metal layer MTL1 may be disposed on the second interlayer insulating layer 142, in the non-display area NDA, and may be disposed on the substrate SUB, in the bendable area BA. The first metal layer MTL1 may be disposed on inclined surfaces of the first buffer layer BF1, the second buffer layer BF2, the gate insulating layer 130, the first interlayer insulating layer 141, and the second interlayer insulating layer 142, at the boundary between the non-display area NDA and the bendable area BA. The first metal layer MTL1 may overlap with the non-display area NDA and the bendable area BA.

The first, second, and third organic layers 150, 160, and 180 may be sequentially stacked on the second interlayer insulating layer 142 in the non-display area NDA. The first, second, and third organic layers 150, 160, and 180 may be disposed in the non-display area NDA and may extend to, and may also be disposed in, the bendable area BA. The first, second, and third organic layers 150, 160, and 180 may overlap with the non-display area NDA and the bendable area BA.

The encapsulation layer TFEL, the third buffer layer BF3, and the first sensor insulating layer TINS1 may be sequentially stacked on the third organic layer 180, in the non-display area NDA. The encapsulation layer TFEL, the third buffer layer BF3, and the first sensor insulating layer TINS1 may overlap with the non-display area NDA, but not with the bendable area BA.

The third metal layer MTL3 may be disposed on the first sensor insulating layer TINS1 in the non-display area NDA. The third metal layer MTL3 may overlap with the non-display area NDA, but not with the bendable area BA. The third metal layer MTL3 may connect to the first metal layer MTL1 through a first contact hole CH1 that penetrates the first organic layer 150, the second organic layer 160, the third organic layer 180, the encapsulation layer TFEL, the third buffer layer BF3, and the first sensor insulating layer TINS1 to expose the first metal layer MTL1.

The second sensor insulating layer TINS2 may be disposed on the third metal layer MTL3, in the non-display area NDA. The second sensor insulating layer TINS2 may overlap with the non-display area NDA, but not with the bendable area BA.

The second sensor insulating layer TINS2 may cover the third metal layer MTL3 and make contact with the first sensor insulating layer TINS1, but embodiments are not limited thereto. The third metal layer MTL3 may extend to the boundary of the non-display area NDA and bendable area BA, completely separating the second sensor insulating layer TINS2 and the first sensor insulating layer TINS1.

The first, second, and third organic layers 150, 160, and 180 may be disposed on the substrate SUB, in the bendable area BA. The first, second, and third organic layers 150, 160, and 180 may be disposed to extend from the non-display area NDA to the bendable area BA. The first, second, and third organic layers 150, 160, and 180 may overlap with the non-display area NDA and the bendable area BA and be disposed at a higher height in the non-display area NDA than the bendable area BA.

Because inorganic insulating layers such as, for example, the first buffer layer BF1, the second buffer layer BF2, the gate insulating layer 130, the first interlayer insulating layer 141, the second interlayer insulating layer 142, the encapsulation layer TFEL, the third buffer layer BF3, the first sensor insulating layer TINS1, and the second sensor insulating layer TINS2, are disposed to not overlap with the bendable area BA, as illustrated in FIGS. 7 and 8, the display device 1 can be flexibly bent in the bendable area BA. In other words, because organic insulating layers such as, for example, the first, second, and third organic layers 150, 160, and 180 are disposed to overlap with the bendable area BA, the display device 1 can be flexibly bent in the bendable area BA.

Figure 9:
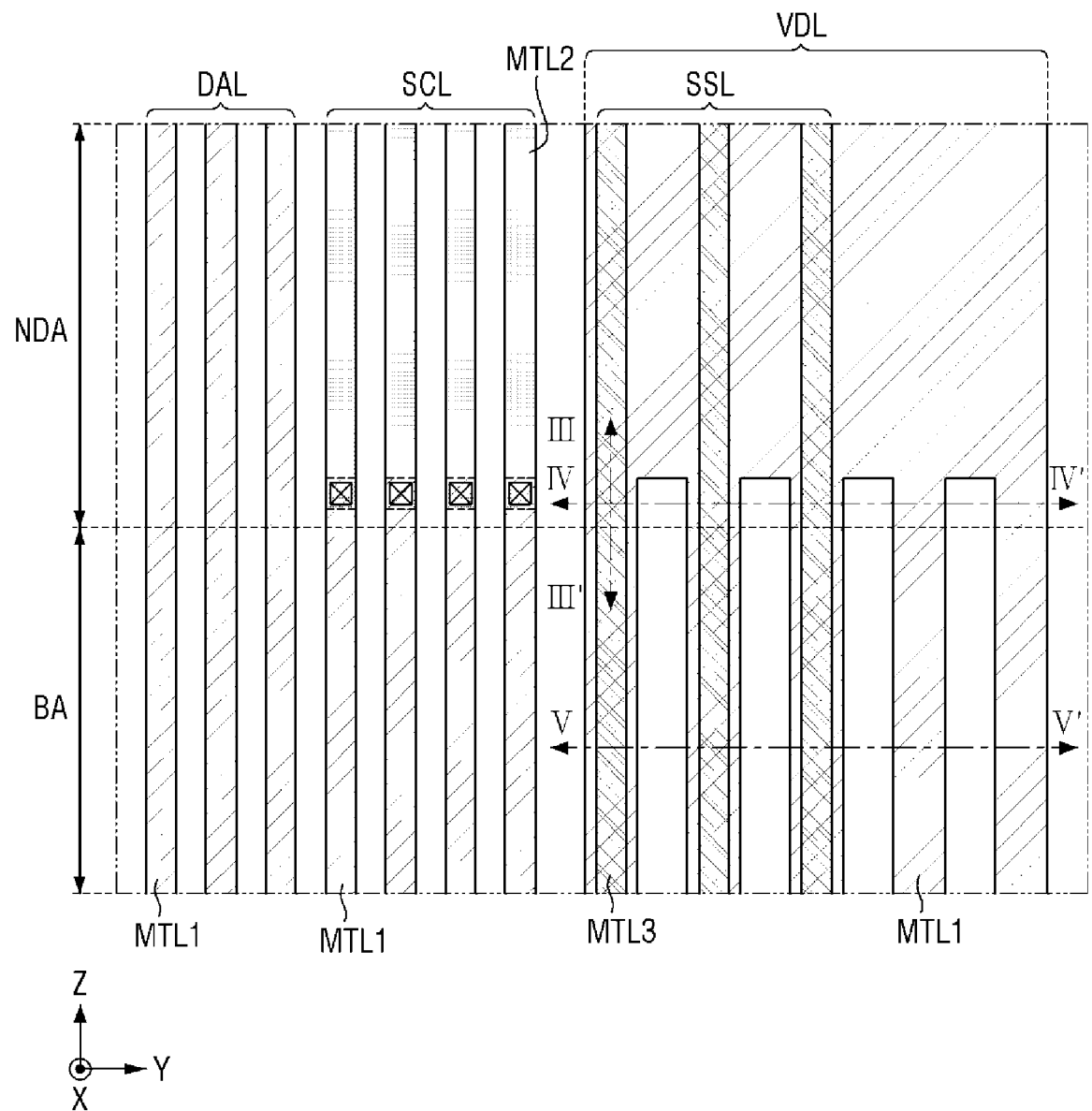
FIG. 9 is a layout view illustrating wires in a non-display area and a bendable area of a display device according to another embodiment of the present disclosure.
Figure 10:
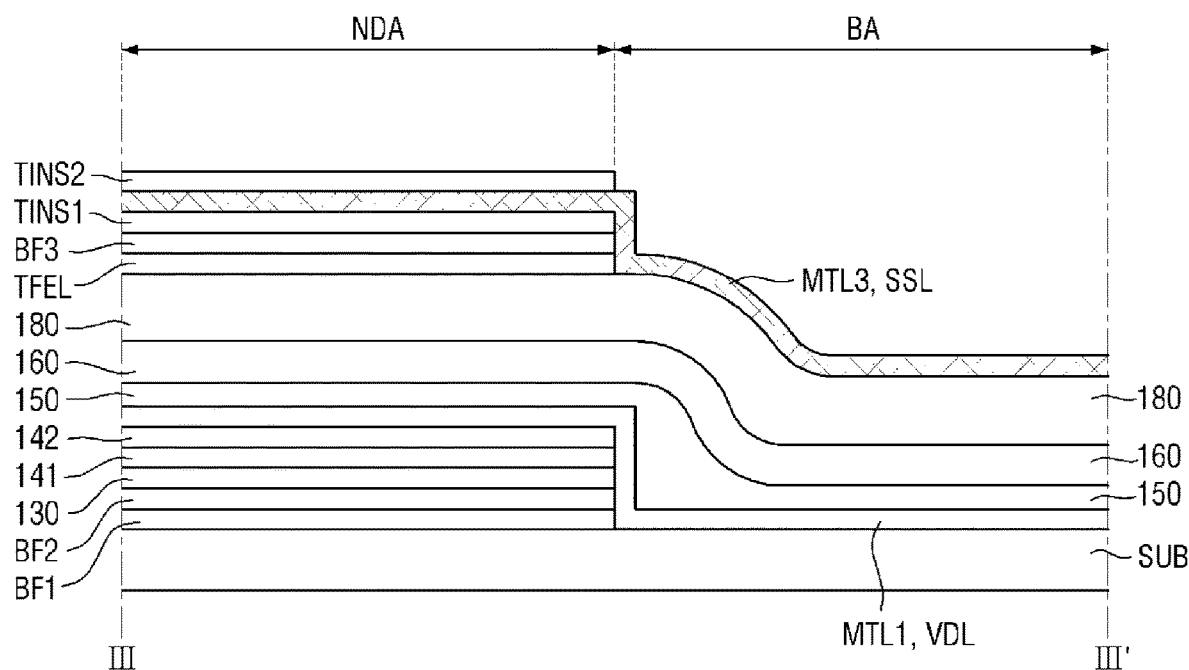
FIG. 10 is a cross-sectional view taken along line of FIG. 9.
Figure 11:
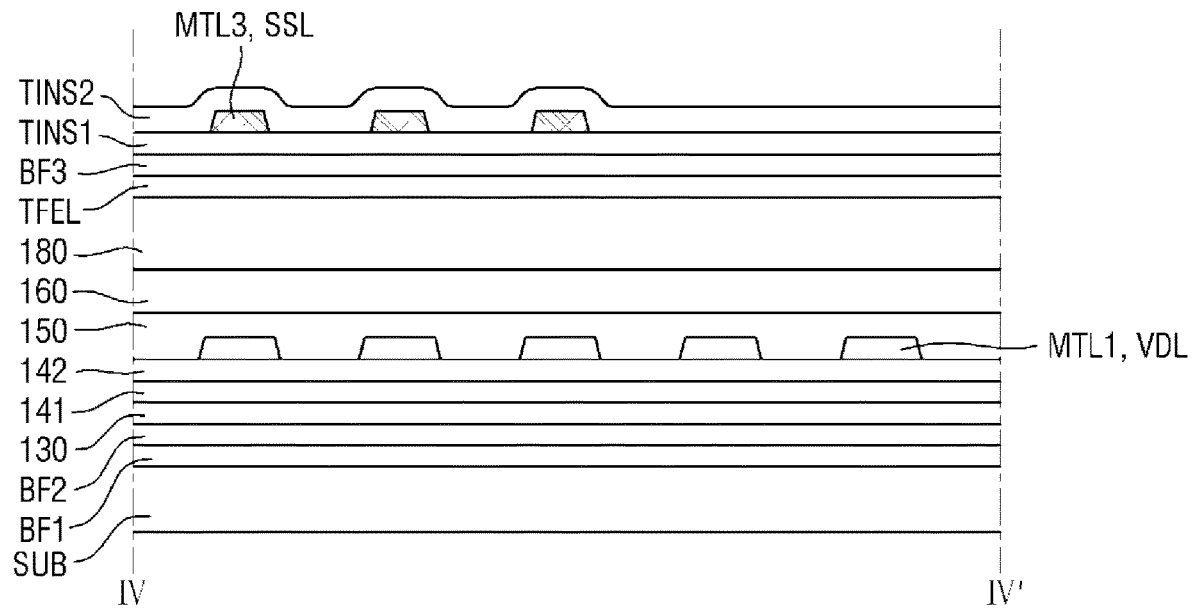
FIG. 11 is a cross-sectional view taken along line IV-IV' of FIG. 9.
Figure 12:
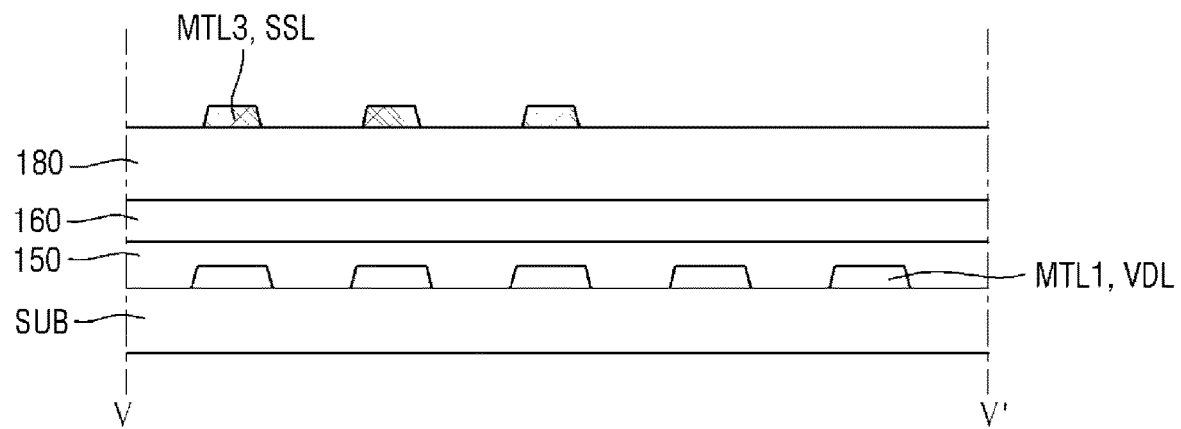
FIG. 12 is a cross-sectional view taken along line V-V' of FIG. 9.

FIG. 9 is a layout view illustrating wires in a non-display area NDA and a bendable area BA of a display device according to another embodiment of the present disclosure, FIG. 10 is a cross-sectional view taken along line of FIG. 9, FIG. 11 is a cross-sectional view taken along line IV-IV' of FIG. 9, FIG. 12 is a cross-sectional view taken along line V-V' of FIG. 9, and FIGS. 13 through 15 are plan views illustrating examples of the arrangement of a power supply line and a sensor wire.

Referring to FIGS. 9 through 15, the display device may include power supply lines VDL and sensor wires SSL. The display device of FIGS. 9 through 15 is almost the same as the display device of FIGS. 7 and 8, except that the sensor wires SSL are disposed to overlap with the power supply lines VDL. The display device of FIGS. 9 through 15 will hereinafter be described. with some relation to the display device of FIGS. 7 and 8.

Referring to FIG. 9, the sensor wires SSL may be disposed to overlap with the power supply lines VDL. Specifically, the sensor wires SSL may be disposed in a non-display area NDA and a bendable area BA to overlap with the power supply lines VDL. The sensor wires SSL may be disposed in parallel to the power supply lines VDL. The power supply lines VDL and sensor wires SSL are representing in FIG. 9 by features with hashed lines.

In one embodiment, the sensor lines SSL may be disposed to overlap one-to-one with the power supply lines VDL. In another embodiment, the sensor wires SSL may be disposed to overlap one-to-many with the power supply lines VDL. For example, one power supply line VDL may overlap with multiple sensor wires SSL, or one sensor wire SSL may overlap with multiple power supply lines VDL. The sensor wires SSL may be formed of the third metal layer MTL3, in the non-display area NDA and the bendable area BA.

Specifically, referring to FIGS. 10 through 12, the non-display area NDA and the bendable area BA may be defined on a substrate SUB.

A first buffer layer BF1, a second buffer layer BF2, a gate insulating layer 130, a first interlayer insulating layer 141, and a second interlayer insulating layer 142 may be sequentially stacked in the non-display area NDA. The first buffer layer BF1, the second buffer layer BF2, the gate insulating layer 130, the first interlayer insulating layer 141, and the second interlayer insulating layer 142 may not overlap with the bendable area BA. The power supply lines VDL, which are formed of a first metal layer MTL1, may be disposed on the second interlayer insulating layer 142. The power supply lines VDL may be disposed on the second interlayer insulating layer 142, in the non-display area NDA, and may be disposed on the substrate SUB, in the bendable area BA. The power supply lines VDL may be disposed on inclined surfaces of the first buffer layer BF1, the second buffer layer BF2, the gate insulating layer 130, the first interlayer insulating layer 141, and the second interlayer insulating layer 142, at the boundary between the non-display area NDA and the bendable area BA. The power supply lines VDL may overlap with the non-display area NDA and the bendable area BA.

First, second, and third organic layers 150, 160, and 180 may be sequentially stacked on the second interlayer insulating layer 142 in the non-display area NDA. The first, second, and third organic layers 150, 160, and 180 may be disposed in the non-display area NDA and may extend to, and may also be disposed in, the bendable area BA. The first, second, and third organic layers 150, 160, and 180 may overlap with the non-display area NDA and the bendable area BA.

An encapsulation layer TFEL, a third buffer layer BF3, and a first sensor insulating layer TINS1 may be sequentially stacked on the third organic layer 180, in the non-display area NDA. The encapsulation layer TFEL, the third buffer layer BF3, and the first sensor insulating layer TINS1 may overlap with the non-display area NDA, but not with the bendable area BA.

Sensor wires SSL, which are formed of a third metal layer MTL3, may be disposed on the first sensor insulating layer TINS1, in the non-display area NDA. The sensor wires SSL may be disposed on the third organic layer 180, in the bendable area BA. The sensor wires SSL may be disposed on side surfaces of the encapsulation layer TFEL, the third buffer layer BF3, and the first sensor insulating layer TINS1, at the boundary between the non-display area NDA and the bendable area BA. The sensor wires SSL may be in contact with the top surface and the side surface of the first sensor insulating layer TINS1, which is disposed in the non-display area NDA. The sensor wires SSL may be disposed to overlap with the non-display area NDA and the bendable area BA.

A second sensor insulating layer TINS2 may be disposed on the sensor wires SSL in the non-display area NDA. The second sensor insulating layer TINS2 may overlap with the non-display area NDA, but not with the bendable area BA.

The sensor wires SSL may be disposed on the third organic layer 180. The sensor wires SSL may be disposed to extend from the non-display area NDA to the bendable area BA. The sensor wires SSL may overlap with the first, second, and third organic layers 150, 160, and 180 and may be in contact with the top surface of the third organic layer 180.

In one embodiment, the power supply lines VDL, the first organic layer 150, the second organic layer 160, the third organic layer 180, and the sensor wires SSL, which are disposed on the substrate SUB, may overlap with one another in the bendable area BA. Thus, because organic layers such as, for example, the first, second, and third organic layers 150, 160, and 180, are disposed to overlap with the bendable area BA, the display device can be flexibly bent in the bendable area BA.

Also, because the power supply lines VDL and the sensor wires SSL are disposed to overlap in the non-display area NDA and the bendable area BA, as large an area as the widths of the sensor wires SSL can be secured in the non-display area NDA and the bendable area BA. Thus, the resistance of wiring can be reduced by increasing the widths of the data lines DAL, the scan lines SCL, the power supply lines VDL, and the sensor wires SSL in the bendable area BA, and any short circuit in the wiring can be prevented by increasing the distance between the wiring.

In the embodiment of FIGS. 9 through 15, unlike in the embodiment of FIGS. 7 and 8, the sensor wires SSL may be disposed to extend in and across the non-display area NDA and the bendable area BA, as the third metal layer MTL3. Thus, the resistance of the sensor wires SSL can be reduced.

Meanwhile, the power supply lines VDL and the sensor wires SSL may have predetermined widths and may be disposed to overlap each other. The power supply lines VDL may have a larger width than the sensor wires SSL, or vice versa.

Figure 13:
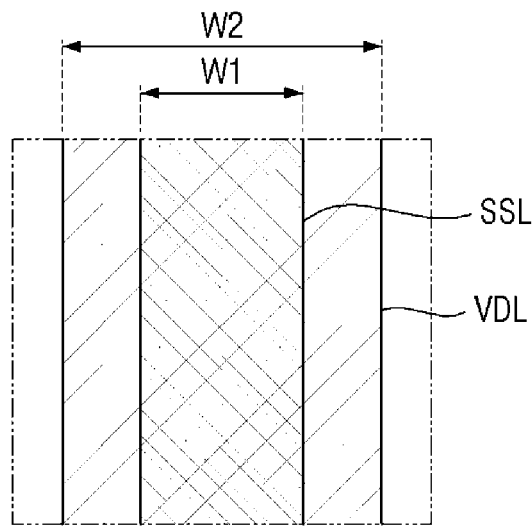
FIGS. 13, 14 and 15 are plan views illustrating examples of the arrangement of a power supply line and a sensor wire.

Referring to FIG. 13, a width W1 of a sensor wire SSL may be smaller than a width W2 of a power supply line VDL. That is, the width W2 of the power supply line VDL may be greater than the width W1 of the sensor wire SSL.

In this case, the sensor wire SSL may be completely overlapped by the power supply line VDL.

Figure 14:
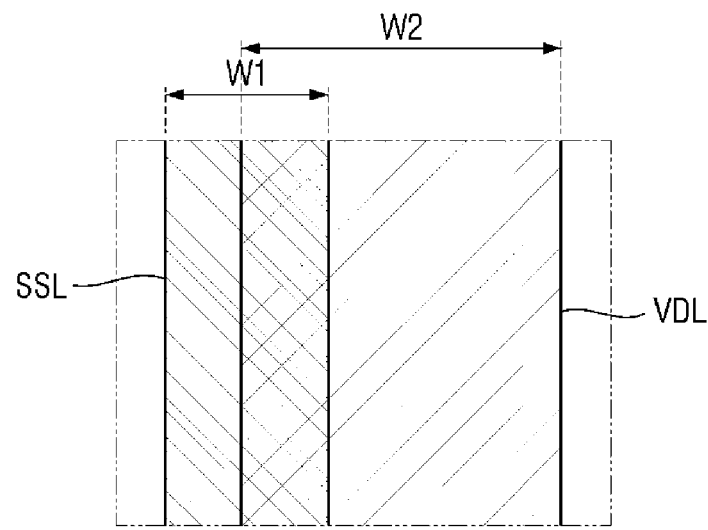

Referring to FIG. 14, the width W1 of the sensor wire SSL may be smaller than the width W2 of the power supply line VDL. The sensor wire SSL may protrude from one side of the power supply line VDL so that portion of the sensor wire SSL may overlap with the power supply line VDL and the rest of the sensor wire SSL may not overlap with the power supply line VDL.

Figure 15:
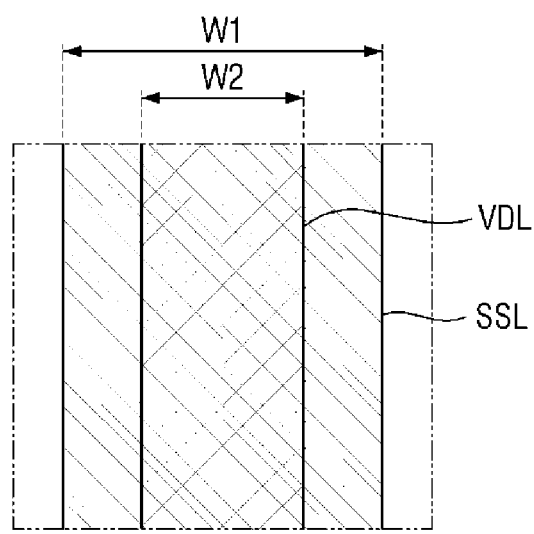

Referring to FIG. 15, the width W1 of the sensor wire SSL may be greater than the width W2 of the power supply line VDL. In this case, the power supply line VDL may be completely overlapped by the sensor wire SSL. The sensor wire SSL may protrude beyond the sensor wire SSL, on both sides thereof, so that portion of the sensor wire SSL may overlap with the power supply line VDL and the rest of the sensor wire SSL may not overlap with the power supply line VDL.

Figure 16:
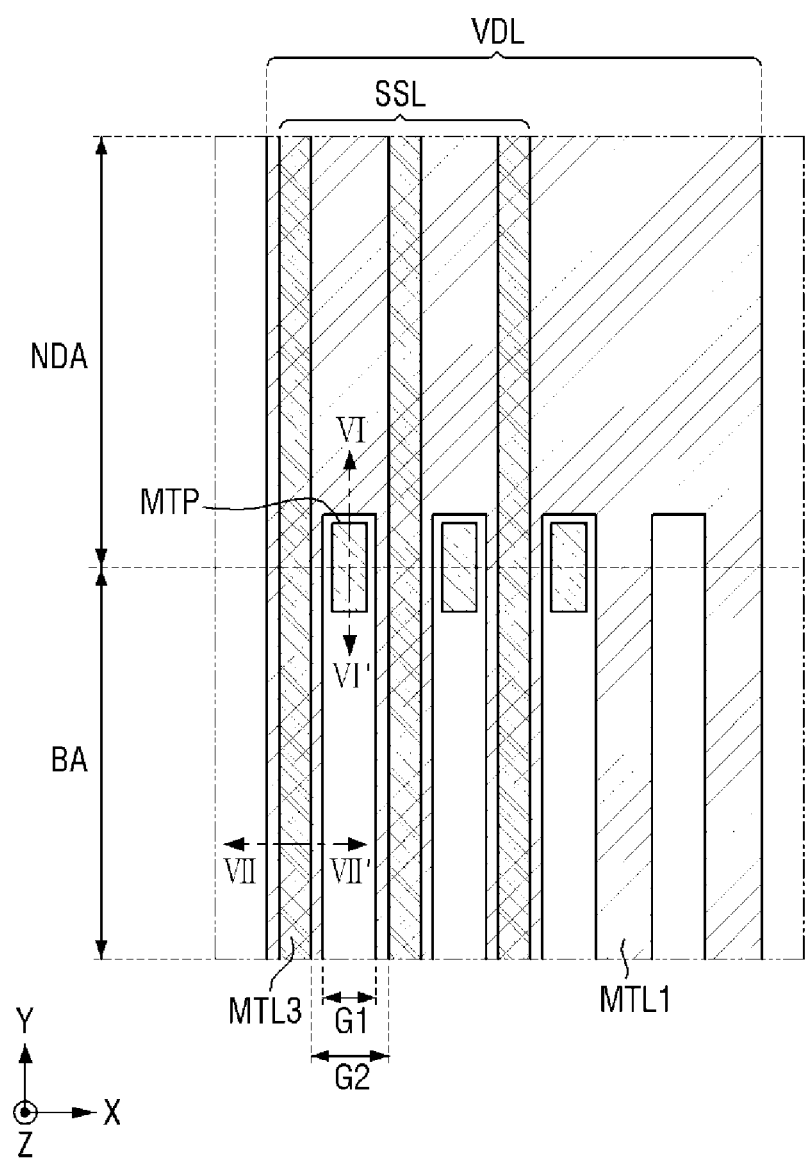
FIGS. 16 and 17 are layout views illustrating the arrangement of power supply lines and sensor wires of a display device according to another embodiment of the present disclosure.
Figure 17:
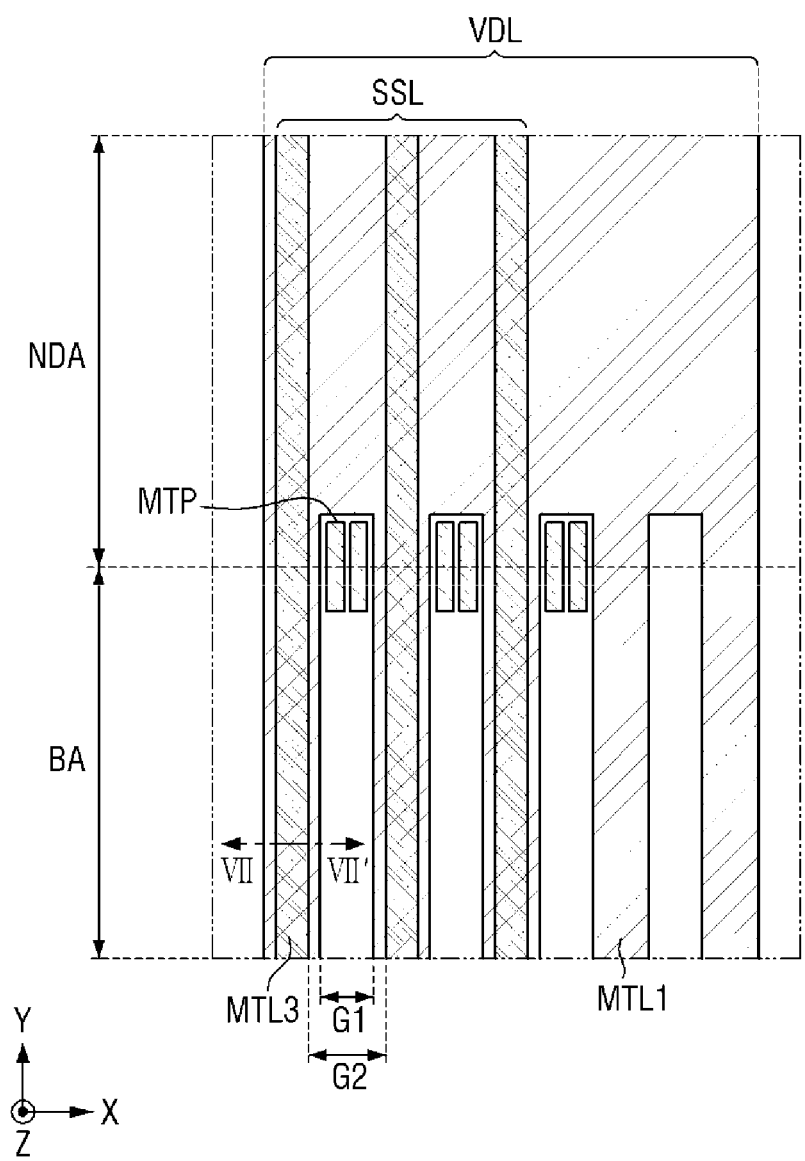
Figure 18:
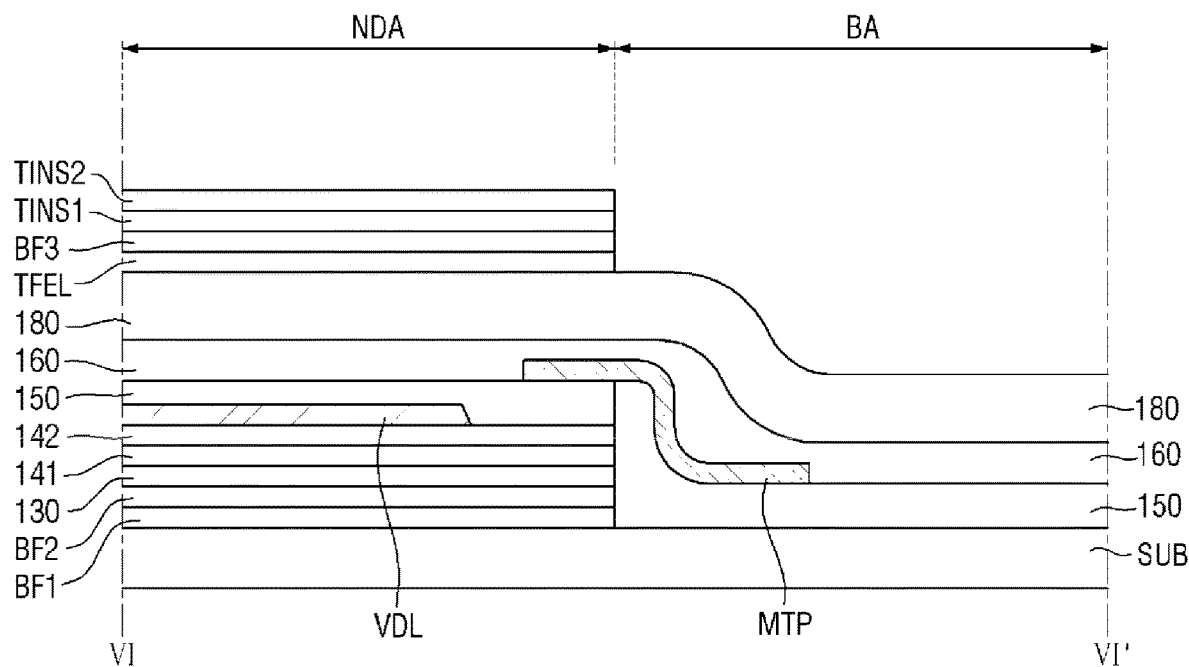
FIG. 18 is a cross-sectional view taken along line VI-VI' of FIG. 16.
Figure 19:
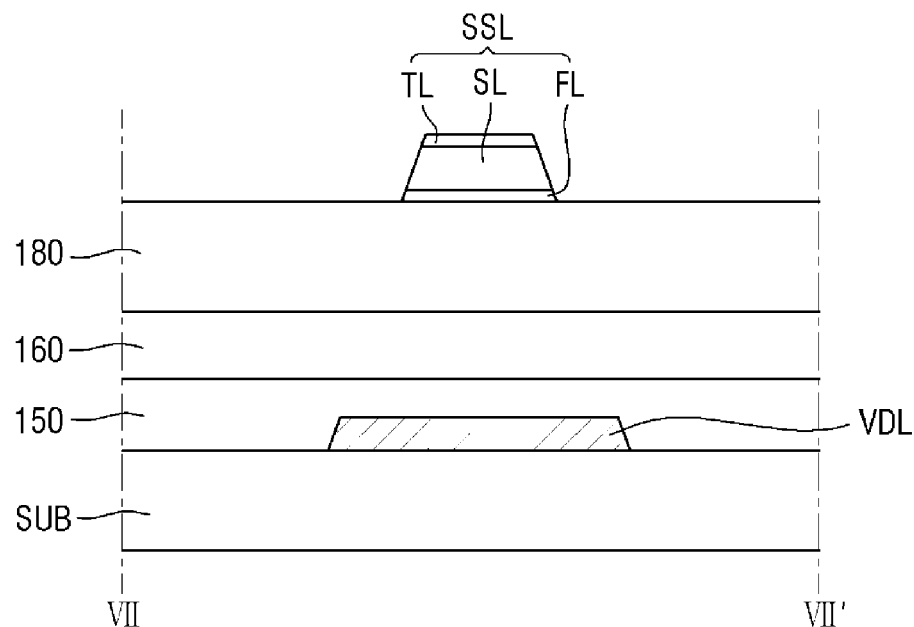
FIGS. 19 and 20 are cross-sectional views taken along line VII-VII' of FIG. 16.
Figure 20:
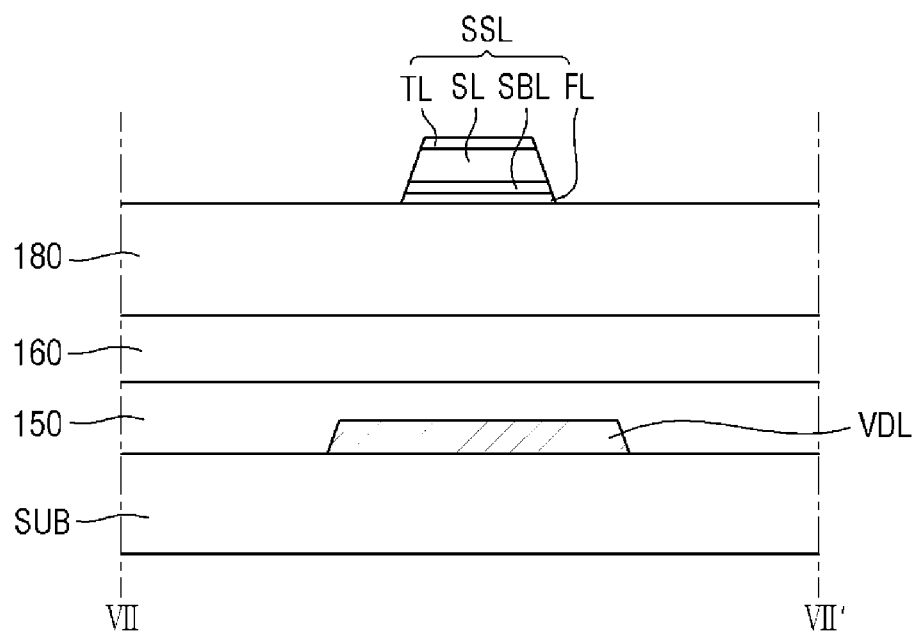

FIGS. 16 and 17 are layout views illustrating the arrangement of power supply lines and sensor wires of a display device according to another embodiment of the present disclosure, FIG. 18 is a cross-sectional view taken along line VI-VI' of FIG. 16, and FIGS. 19 and 20 are cross-sectional views taken along line VII-VII' of FIG. 16.

Referring to FIGS. 16 through 20, the display device may include power supply lines VDL and sensor wires SSL. The display device of FIGS. 16 through 20 is almost the same as the display devices of FIGS. 7 through 15, except that metal patterns MTP are disposed between the sensor wires SSL. The display device of FIGS. 16 through 20 will hereinafter be described, focusing mainly on the differences with the display device of FIGS. 7 through 15.

Referring to FIG. 16, the power supply lines VDL and the sensor wires SSL may be disposed to extend in both a non-display area NDA and a bendable area BA in a second direction (or a Y-axis direction). The power supply lines VDL may branch off in the non-display area NDA to be spaced apart from one another in the bendable area BA. The sensor wires SSL may be spaced apart from one another in both the non-display area NDA and the bendable area BA.

The metal patterns MTP may be disposed in the non-display area NDA and the bendable area BA. Specifically, the metal patterns MTP may be disposed between gaps G1 between the power supply lines VDL and/or in gaps G2 between the sensor wires SSL. The metal patterns MTP may be spaced apart from the power supply lines VDL and from the sensor wires SSL and may be disposed to not overlap with the power supply lines VDL and the sensor wires SSL.

For example, as illustrated in FIG. 16, a metal pattern MTP may be disposed between every two power supply lines VDL or between every two sensor wires SSL. In another example, as illustrated in FIG. 17, two metal patterns MTP may be disposed between every two power supply lines VDL or between every two sensor wires SSL. However, the present disclosure is not limited to these examples. In yet another example, three or more metal patterns MTP may be disposed between every two power supply lines VDL or between every two sensor wires SSL.

Referring to FIG. 18, the non-display area NDA and the bendable area BA may be defined on a substrate SUB.

A first buffer layer BF1, a second buffer layer BF2, a gate insulating layer 130, a first interlayer insulating layer 141, and a second interlayer insulating layer 142 may be sequentially stacked in the non-display area NDA. The first buffer layer BF1, the second buffer layer BF2, the gate insulating layer 130, the first interlayer insulating layer 141, and the second interlayer insulating layer 142 may not overlap with the bendable area BA. The power supply lines VDL may be disposed on the second interlayer insulating layer 142. The power supply lines VDL may be disposed on the second interlayer insulating layer 142, in the non-display area NDA, and may be disposed on the substrate SUB, in the bendable area BA. The power supply lines VDL may be disposed on inclined surfaces of the first buffer layer BF1, the second buffer layer BF2, the gate insulating layer 130, the first interlayer insulating layer 141, and the second interlayer insulating layer 142, at the boundary between the non-display area NDA and the bendable area BA. The power supply lines VDL may overlap with the non-display area NDA and the bendable area BA.

First, second, and third organic layers 150, 160, and 180 may be sequentially stacked on the second interlayer insulating layer 142 in the non-display area NDA. The first, second, and third organic layers 150, 160, and 180 may be disposed in the non-display area NDA and may extend to, and may also be disposed in, the bendable area BA. The first, second, and third organic layers 150, 160, and 180 may overlap with the non-display area NDA and the bendable area BA.

The metal patterns MTP may be disposed between the first and second organic layers 150 and 160, in the non-display area NDA. Specifically, the metal patterns MTP may be disposed on the first organic layer 150 and be covered by the second organic layer 160. The metal patterns MTP may be disposed to continuously extend from the non-display area NDA to the bendable area BA but not extend a total length of the non-display area NDA or bendable area BA. However embodiments are not limited thereto. The metal patterns MTP may extend a length of the non-display area NDA and/or a length of the bendable area BA. The metal patterns MTP may be disposed to overlap with the non-display area NDA and the bendable area BA.

An encapsulation layer TFEL, a third buffer layer BF3, a first sensor insulating layer TINS1, and a second sensor insulating layer TINS2 may be sequentially stacked on the third organic layer 180, in the non-display area NDA. The encapsulation layer TFEL, the third buffer layer BF3, the first sensor insulating layer TINS1, and the second sensor insulating layer TINS2 may overlap with the non-display area NDA, but not with the bendable area BA.

In the embodiment of FIGS. 16 through 20, inorganic layers such as, for example, the first buffer layer BF1, the second buffer layer BF2, the gate insulating layer 130, the first interlayer insulating layer 141, the second interlayer insulating layer 142, the encapsulation layer TFEL, the third buffer layer BF3, the first sensor insulating layer TINS1, and the second sensor insulating layer TINS2 are disposed in the non-display area NDA, but not in the bendable area BA. Also, organic layers such as, for example, the first, second, and third organic layers 150, 160, and 180, are disposed in both the non-display area NDA and the bendable area BA, a height difference may be made between the non-display area NDA and the bendable area BA.

The metal patterns MTP may be formed at the boundary between the non-display area NDA and the bendable area BA where there exists a height difference. Thus, the height difference between the non-display area NDA and the bendable area BA can be alleviated. Accordingly, the sensor wires SSL on the third organic layer 180 can be prevented from being disconnected due to the height difference between the non-display area NDA and the bendable area BA.

FIG. 18 illustrates that the metal patterns MTP are disposed on the first organic layer 150. In this case, for example, the metal patterns MTP may be formed of the same material as the first connecting electrodes ANDE1 of FIG. 6. In another example, the metal patterns MTP may be formed of the same material as the first electrodes S of the TFTs ST of FIG. 6. Alternatively, the metal patterns MTP may be disposed on the first interlayer insulating layer 141, in which case, the metal patterns MTP may be formed of the same material as the capacitor electrodes CAE of FIG. 6. Yet alternatively, the metal patterns MTP may be disposed on the second organic layer 160, in which case, the metal patterns MTP may be formed of the same material as the first light-emitting electrodes 171 of FIG. 6. However, the present disclosure is not limited to these examples, and the metal patterns MTP may be formed of any conductive layer of the display device of FIG. 6.

Referring to FIGS. 19 and 20, the sensor wires SSL may have a multilayer structure.

Specifically, referring to FIG. 19, a sensor wire SSL may have a multilayer structure in which first, second, and third layers FL, SL, and TL are stacked. The first layer FL, which is the lowermost layer of the sensor wire SSL, may be a layer in contact with a third organic layer 180 below the sensor wire SSL. The first layer FL may be a metal nitride layer. For example, the first layer FL may be formed of one of molybdenum nitride, aluminum nitride, chromium nitride, titanium nitride, nickel nitride, neodymium nitride, and copper nitride.

The second layer SL may be disposed on the first layer FL, below the third layer TL. The second layer SL, which is a low-resistance metal layer, may be formed as, for example, a single- or multilayer layer including Mo, Al, Cr, Au, Ti, Ni, Nd, Cu, or an alloy thereof.

The third layer TL may be disposed on the second layer SL and may protect the second layer SL. The third layer TL may be formed as, for example, a single- or multilayer layer including Mo, Al, Cr, Au, Ti, Ni, Nd, Cu, or an alloy thereof.

The sensor wire SSL may include metal nitride as the material of the first layer FL, which is in contact with the third organic layer 180. Thus, the generation of metal oxide therein by outgassing from organic layers disposed therebelow such as, for example, a first organic layer 150, a second organic layer 160, and the third organic layer 180 can be prevented. If metal oxide is generated on side surfaces of the first layer FL, a short circuit may occur between the sensor wire SSL and its neighboring sensor wires SSL. However, because the first layer FL is formed of metal nitride, the generation of metal oxide can be prevented, and a short circuit between wires can be prevented.

The sensor wire SSL may have a stack structure in which a first layer FL of titanium nitride, a second layer SL of Al, and a third layer TL of Ti are stacked, but the present disclosure is not limited thereto. The second and third layers SL and TL may be formed of nearly any type of metal as long as the first layer FL is formed of metal nitride.

Alternatively, referring to FIG. 20, the sensor wire SSL may further include a sub-layer SBL, which is interposed between the first and second layers FL and SL. The sub-layer SBL, which improves the characteristics of the interface between the first and second layers FL and SL, may be formed as a single- or multilayer layer including Mo, Al, Cr, Au, Ti, Ni, Nd, Cu, or an alloy thereof.

As described above, inorganic insulating layers may be disposed to not overlap with a bendable area BA, and first, second, and third organic layers 150, 160, and 180 are disposed to overlap with the bendable area BA. Accordingly, a display device can be flexibly bent in the bendable area BA.

Also, power supply lines VDL and sensor wires SSL are disposed to overlap in both a non-display area NDA and the bendable area BA. Accordingly, the resistance of wires can be reduced in the non-display area NDA and the bendable area BA by increasing the width of the wires, and any short circuit between the wires can be prevented by increasing the distance between the wires.

Also, the sensor wires SSL are disposed to extend in and across the non-display area NDA and the bendable area BA, as a third metal layer MTL3. Thus, the resistance of the sensor wires SSL can be reduced.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
    a substrate including a display area, a non-display area, which is disposed on a periphery of the display area, and a bendable area, which is disposed on one side of the non-display area;
    a display layer disposed on the substrate and including light-emitting elements;
    a sensor electrode layer disposed on the display layer;
    power supply lines disposed to extend from the display layer in the display area to the non-display area and the bendable area; and
    sensor wires disposed to extend from the sensor electrode layer to the non-display area and the bendable area,
    wherein in the non-display area and the bendable area, the power supply lines and the sensor wires overlap, and
    wherein a width of one of the power supply lines and the sensor wires is greater than a width of the other the power supply lines and the sensor wires.

2. The display device of claim 1, wherein the power supply lines and the sensor wires are arranged in parallel and at least partially overlap.

3. The display device of claim 1, wherein in the bendable area, the power supply lines overlap one-to-one or one-to-many with the sensor wires.

4. The display device of claim 1, further comprising:
    metal patterns disposed between the sensor wires.

5. The display device of claim 4, wherein the metal patterns are disposed to extend from the non-display area to the bendable area.

6. The display device of claim 4, wherein at least one metal pattern is disposed between two sensor wires.

7. A display device comprising:
    a substrate including a display area, a non-display area, which is disposed on a periphery of the display area, and a bendable area, which is disposed on one side of the non-display area;
    a display layer disposed on the substrate, in the display area, and including light-emitting elements;
    a sensor electrode layer disposed on the display layer;
    power supply lines disposed to extend from the display layer in the display area to the non-display area and the bendable area;
    organic layers disposed on the power supply lines to extend from the display area to the non-display area; and
    sensor wires disposed on the organic layers to extend from the sensor electrode layer to the non-display area and the bendable area, wherein in the non-display area and the bendable area, the power supply lines and the sensor wires overlap with the organic layers interposed therebetween, wherein each of the sensor wires includes a first layer, a second layer, which is disposed on the first layer, and a third layer, which is disposed on the second layer, the first layer includes metal nitride, and wherein the first layer is in contact with the organic layers.

8. The display device of claim 7, wherein the display layer includes a thin-film transistor and the power supply lines, which are disposed on the substrate, the organic layers, which are disposed on the TFT and the power supply lines, and a light-emitting element layer, which is disposed on the organic layers.

9. The display device of claim 8, wherein the TFT includes an active layer, which is disposed on the substrate, a gate electrode, which is disposed on the active layer, first and second electrodes, which are disposed on the gate electrode and are connected to active layer, and inorganic insulating layers, which are disposed between the active layer and the gate electrode and between the gate electrode and the first electrode.

10. The display device of claim 9, wherein the inorganic insulating layers are disposed in the display area and the non-display area and do not overlap with the bendable area.

11. The display device of claim 9, further comprising: metal patterns disposed between the sensor wires,
wherein the metal patterns overlap with the non-display area and the bendable area.

12. The display device of claim 11, wherein the metal patterns are disposed to overlap with the inorganic insulating layers and the organic layers, in the non-display area, and to overlap with the organic layers, in the bendable area.

13. The display device of claim 8, wherein the sensor electrode layer includes driving electrodes and sensing electrodes, which are disposed on the display layer, and a sensor insulating layer, which is disposed on the driving electrodes and the sensing electrodes.

14. The display device of claim 13, wherein the sensor insulating layer is disposed in the display area and the non-display area and does not overlap with the bendable area.

15. The display device of claim 13, wherein the sensor wires are connected to the driving electrodes and the sensing electrodes to extend to the non-display area and the bendable area.

16. The display device of claim 15, wherein the sensor wires are in contact with a top surface and a side surface of the sensor insulating layer, in the non-display area, and are disposed on the organic layers, in the bendable area.

17. The display device of claim 7, wherein each of the sensor wires further includes a sub-layer, which is interposed between the first and second layers and includes a metal.

18. A display device comprising:
a substrate including a display area, a non-display area, which is disposed on a periphery of the display area, and a bendable area, which is disposed on one side of the non-display area;
a display layer disposed on the substrate and including light-emitting elements;
a sensor electrode layer disposed on the display layer;
power supply lines disposed to extend from the display layer in the display area to the non-display area and the bendable area; and
sensor wires disposed to extend from the sensor electrode layer to the non-display area and the bendable area,
metal patterns disposed between the sensor wires,
wherein in the non-display area and the bendable area, the power supply lines and the sensor wires overlap.

* * * * *